United States Patent
Murata et al.

(10) Patent No.: US 8,277,163 B2
(45) Date of Patent: Oct. 2, 2012

(54) SUBSTRATE TRANSFER APPARATUS, SUBSTRATE PROCESS SYSTEM, AND SUBSTRATE TRANSFER METHOD

(75) Inventors: Akira Murata, Koshi (JP); Suguru Enokida, Koshi (JP); Yuichi Douki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1012 days.

(21) Appl. No.: 11/790,568

(22) Filed: Apr. 26, 2007

(65) Prior Publication Data

US 2007/0274811 A1 Nov. 29, 2007

(30) Foreign Application Priority Data

May 25, 2006 (JP) .................................. 2006-145136

(51) Int. Cl.
*B65G 1/00* (2006.01)
(52) U.S. Cl. ........................ 414/282; 414/937
(58) Field of Classification Search .................. 414/217,
414/935, 937, 266, 267, 268, 269, 277, 281,
414/282, 619
See application file for complete search history.

(56) References Cited

U.S. PATENT DOCUMENTS

| | | | | |
|---|---|---|---|---|
| 4,775,281 A | * | 10/1988 | Prentakis | 414/416.03 |
| 5,562,387 A | * | 10/1996 | Ishii et al. | 414/416.02 |
| 5,564,889 A | | 10/1996 | Araki | |
| 5,950,495 A | * | 9/1999 | Ogawa et al. | 74/490.01 |
| 6,143,083 A | * | 11/2000 | Yonemitsu et al. | 118/719 |
| 6,302,927 B1 | * | 10/2001 | Tanigawa | 29/25.01 |
| 6,428,262 B1 | | 8/2002 | Vanderpot et al. | |
| 6,890,862 B2 | * | 5/2005 | Wagner et al. | 438/706 |
| 2003/0086775 A1 | * | 5/2003 | Farassat | 414/403 |
| 2005/0123383 A1 | | 6/2005 | Goto et al. | |
| 2006/0130751 A1 | * | 6/2006 | Volfovski et al. | 118/300 |

FOREIGN PATENT DOCUMENTS

| | | |
|---|---|---|
| JP | 6-271009 | 9/1994 |
| JP | 9-270450 | 10/1997 |
| JP | 09-270450 | 10/1997 |
| JP | 11-330189 | 11/1999 |

OTHER PUBLICATIONS

Taiwan Office Action issued on Oct. 25, 2010 for Application No. 096118467 w/ English language translation.
Japanese Office Action issued on Mar. 2, 2012 for Application No. 2010-265626 with English translation.

* cited by examiner

*Primary Examiner* — Saul Rodriguez
*Assistant Examiner* — Glenn Myers
(74) *Attorney, Agent, or Firm* — Smith, Gambrell & Russell, LLP

(57) ABSTRACT

A substrate transfer apparatus includes forks that are vertically spaced apart from each other with a predetermined distance. When the forks take out the substrates from the first substrate containing part, each of the forks lifts the substrate and supports the same by moving upward from a pre-loading position located below the substrate to be taken out by a predetermined unloading stroke amount. A value of the predetermined distance is set to be equal to the sum of the distance between the substrates contained in the first substrate containing part and the unloading stroke amount.

7 Claims, 11 Drawing Sheets

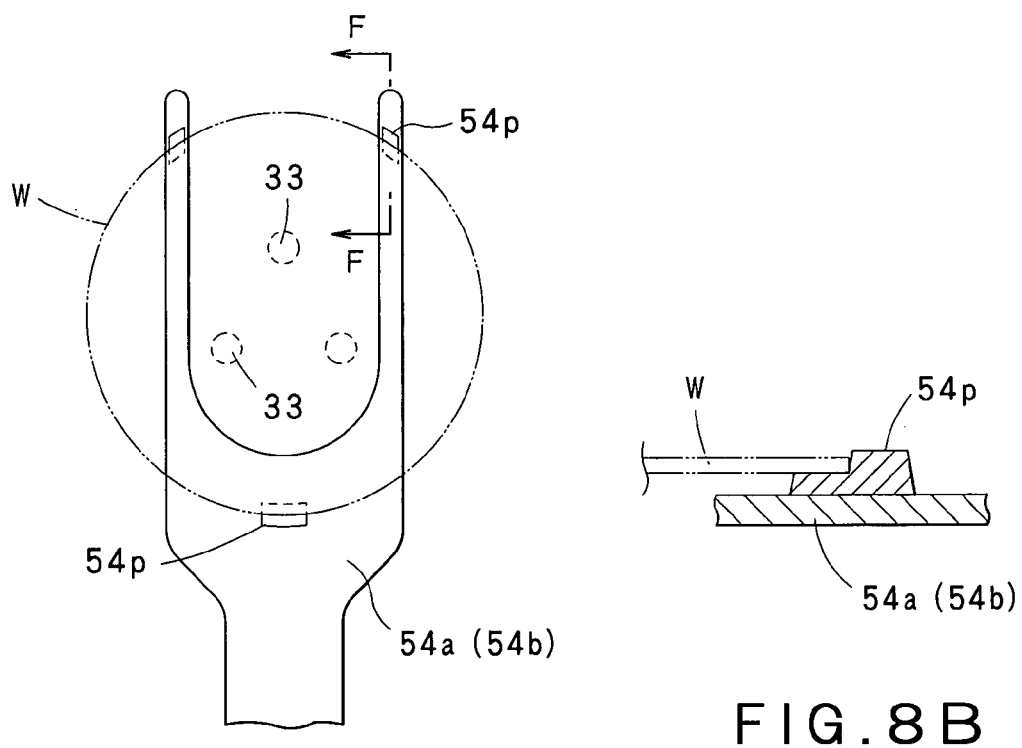
FIG. 8A
FIG. 8B
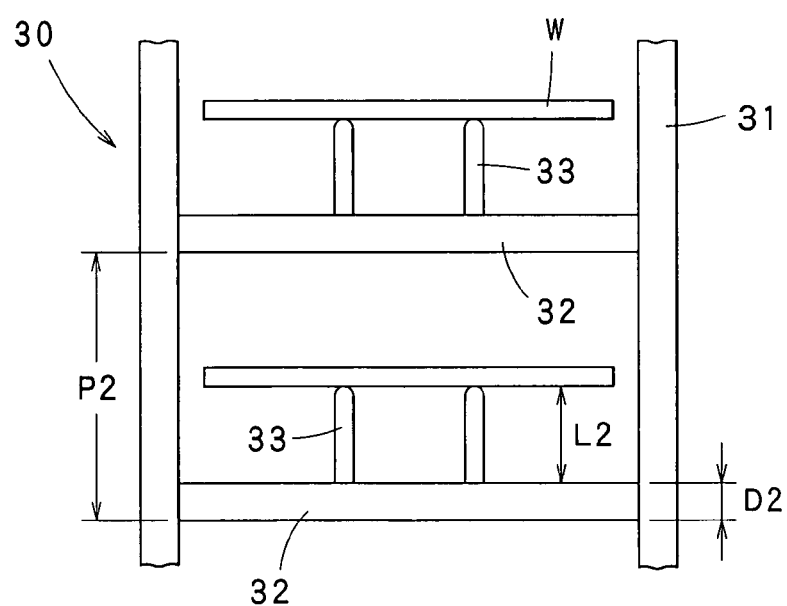
FIG. 9

SUBSTRATE TRANSFER APPARATUS, SUBSTRATE PROCESS SYSTEM, AND SUBSTRATE TRANSFER METHOD

FIELD OF THE INVENTION

The present invention relates to a substrate transfer apparatus for transferring a substrate such as a semiconductor wafer, a substrate process system including the substrate transfer apparatus, and a substrate transfer method. In particular, the present invention pertains to a substrate transfer apparatus which is capable of rapidly transferring a plurality of substrates from a first substrate containing part to a second substrate containing part, and a substrate process system including the substrate transfer apparatus, and a substrate transfer method.

BACKGROUND OF THE INVENTION

There have been conventionally known various substrate process systems for subjecting substrates such as semiconductor wafers to a cleaning process, a heating process, and so on.

Referring to FIGS. 14 and 15, an example of such a conventional substrate process system is described. FIG. 14 is a schematic side view showing a structure of the conventional substrate process system, and FIG. 15 is a sectional view of the substrate process system shown in FIG. 14 taken along the line E-E.

As shown in FIGS. 14 and 15, the conventional substrate process system 70 includes a carrier station 70*a* and a process station 70*b* adjacent to the carrier station 70*a*. In the carrier station 70*a*, a semiconductor wafer W (hereafter also referred to as "wafer W") which is not processed yet and/or the wafer W which has been already processed are placed. In the process station 70*b*, the wafer W is subjected to a cleaning process and a heating process succeeding the cleaning process. The carrier station 70*a* includes a FOUP (Front opening Unified Pod, wafer storage pod) 20 capable of containing a plurality of, e.g., twenty-five wafers W which are horizontally arranged at predetermined vertical intervals, and a stage 25 on which a plurality of, e.g., four FOUPs 20 can be placed in parallel. The process station 70*b* includes a transit unit (TRS; Transit Station) 30 in which the wafer W transferred from the FOUP 20 is temporarily placed, and a plurality of, e.g., four process chambers (SPIN) 40 of a spin-type to which the wafer W temporarily placed in the transit unit 30 is transferred (FIG. 14 shows only two of the four process chambers 40). In the process chambers 40, the wafer W is subjected to a cleaning process, a drying process, and so on.

In the carrier station 70*a*, there is disposed a first wafer transfer apparatus (CRA) 80 which can move to transfer the wafer W between the FOUP 20 and the transit unit 30. Similarly, in the process station 70*b*, there is disposed a second wafer transfer apparatus (PRA) 60 which can move to transfer the wafer W between the transit unit 30 and the process chamber 40.

The first wafer transfer apparatus 80 to be used for transferring the wafer W between the FOUP 20 and the transit unit 30 is described in detail below.

The first wafer transfer apparatus 80 includes a base member 81 which runs along a rail (not shown) extending in the Y direction in FIG. 15, and a vertical moving mechanism 82 disposed on an upper surface of the base member 81, the vertical moving mechanism 82 being elongatable and compressible in the Z direction. A support base 85 is disposed on an upper part of the vertical moving mechanism 82. A fork support member 83 is fixed to the support base 85. A fork 84 for holding the wafer W is supported by the fork support member 83.

As shown in FIG. 15, the vertical moving mechanism 82 can rotate in the θ direction relative to the base member 81. Namely, the support base 85 can move in the Y direction and the Z direction, and rotates in the θ direction. The fork 84 is disposed above the support base 85. The fork support member 83 has a horizontal moving mechanism (not shown) which is fixed on a proximal end of the fork 84. Thus, the fork 84 can be moved in the X direction in FIGS. 14 and 15 by the horizontal moving mechanism.

How the wafer W is taken out from the FOUP 20 by the fork 84 is described. The fork 84 is moved at first to a pre-unloading position which is a position below the wafer W to be taken out, and then the support base 85 is moved upward to move the fork 84 upward by a predetermined distance from the pre-unloading position. In the course of the upward movement of the fork 84, the fork 84 lifts the wafer W contained in the FOUP 20, so that the wafer W is transferred to an upper surface of the fork 84.

In order to sequentially, continuously process the plurality of wafers W in the process chamber 40, the wafers W contained in the FOUP 20 should be sequentially transferred to the transit unit 30. However, the first wafer transfer apparatus 80 has only one fork 84. Thus, when the plurality of wafers W contained in the FOUP 20 are sequentially transferred to the transit unit 30, a series of steps has to be repeated in which the wafer transfer apparatus 80 moves near the FOUP 20 at first, then the fork 84 takes out one wafer W from the FOUP 20 and holds the same, the first wafer transfer apparatus 80 then moves near the transit unit 30, and thereafter the fork 84 holding the wafer W delivers the wafer W to the transit unit 30.

However, these steps for sequentially transferring the plurality of wafers W contained in the FOUP 20 require a lot of time, which degrades a general processing capability of the substrate process system 70.

Another known wafer transfer apparatus includes a plurality of forks that simultaneously moves horizontally forward, upward or downward, and then horizontally rearward, as disclosed in JP9-270450A, for example. With the use of the wafer transfer apparatus disclosed in JP9-270450A, it is possible to take out a plurality of wafers W from the FOUP, and to collectively send the wafers W to the transit unit by means of the plurality of forks. However, this method is actually difficult to carry out. The reason is as follows.

In the general substrate process system, a distance between the adjacent wafers W of 300 mm in diameter contained in the FOUP is determined to be about 10 mm by a standard or the like, and this distance between the wafers W cannot be varied in the FOUP. The pre-unloading position on which the wafer W is taken out from the FOUP is set at a predetermined position based on a structure of the FOUP.

Meanwhile, a distance between the forks for transferring the wafers W from the FOUP to the transit unit must be equal to the distance between the wafers W contained in the FOUP. In addition, it is generally necessary to design a distance between the wafers W, when the wafers W are received in the transit unit, is equal to the distance between the wafers contained in the FOUP.

However, it is sometimes difficult in terms of design to conform, to the distance between the wafers W in the transit unit, a distance between forks in the second wafer transfer apparatus (wafer transfer apparatus 60 in FIG. 15) for carrying the wafers W between the transit unit and the process chamber. This is because the second wafer transfer apparatus which carries out the wafers W from the transit unit is required to operate at a speed higher than that of the first wafer transfer apparatus, in order that the second wafer transfer apparatus accesses the plurality of process chambers. Thus, the fork for holding the wafer W of the second wafer transfer apparatus is needed to have a strength larger than that of the fork of the first wafer transfer apparatus. For this reason, the fork of the second wafer transfer apparatus has an enlarged thickness. Thus, a distance between the wafers W in the transit unit to which the second wafer transfer apparatus comes close must be enlarged. In addition, when the plurality of wafers W are simultaneously taken out from the FOUP by the plurality of forks, the wafers W corresponding to the forks are taken out from above or from below of the FOUP. In this case, when it is necessary to take every other wafer W in the FOUP depending on a process, such a structure is disadvantageous.

SUMMARY OF THE INVENTION

As described above, in the conventional substrate process system, it takes a long time to sequentially transfer the plurality of wafers W contained in a FOUP to a transit unit, which degrades a general processing capability of the substrate process system. Further, there is a demand for a substrate transfer apparatus which can take out the wafers W from the FOUP one by one, or in a sequential order from the FOUP from above or from below thereof.

The present invention has been made in view of the above problems. The object of the present invention is to provide a substrate transfer apparatus and a substrate transfer method for more rapidly transferring substrates from a first substrate containing part to a second substrate containing part. Another object of the present invention is to provide a substrate process system including the substrate transfer apparatus to thereby improve a throughput (processing capability).

The present invention is a substrate transfer apparatus for transferring a substrate from a first substrate containing part for containing a plurality of substrates that are vertically spaced apart from each other with a first distance $P1$ therebetween to a second substrate containing part for containing a plurality of substrates, the substrate transfer apparatus comprising: a fork support part capable of vertically moving relative to the first substrate containing part and the second substrate containing part; and a plurality of forks for holding the substrates, that are capable of horizontally moving independently from each other, the forks being disposed on the fork support part in such a manner that: the forks are vertically spaced apart from each other with a predetermined third distance $P3$ therebetween; when the forks take out the substrates from the first substrate containing part, each of the forks lifts the substrate and supports the same by moving upward by a predetermined unloading stroke amount $ST1$ from a pre-unloading position located below the substrate to be taken out; and a value of the third distance $P3$ is set to be equal to the sum of the first distance $P1$ and the unloading stroke amount $ST1$.

According to the substrate transfer apparatus of the present invention, when the substrates are taken out from the first substrate containing part, the upper fork of the two adjacent forks of the plurality of forks is horizontally moved forward to the pre-unloading position, then the upper fork and the lower fork are simultaneously moved upward so that the substrate is lifted by the upper fork and supported thereon, then the upper fork is horizontally moved rearward and simultaneously therewith the lower fork is horizontally moved forward so that the upper fork holding the substrate is retracted from the first substrate containing part and the lower fork is moved to the pre-unloading position, and then the upper fork and the other fork are simultaneously further moved upward so that the substrate is lifted by the lower fork and supported thereon.

In the step of taking out the substrates from the first substrate containing part, the horizontal rearward movement of the upper fork and the horizontal forward movement of the lower fork are simultaneously carried out. Thus, as compared with a case in which a single fork transfers the substrates, a time required for taking out the substrates by the wafer transfer apparatus from the first substrate containing part can be shortened. In addition, the two adjacent forks of the plurality of forks of the wafer transfer apparatus can take out the two substrates which are vertically adjacent to each other in the first substrate containing part. Thus, the substrates can be sequentially taken out from the first substrate containing part from above or from below thereof.

In the substrate transfer apparatus according to the present invention, it is preferable that: the second substrate containing part is configured to contain the plurality of substrates that are vertically spaced apart from each other with a second distance $P2$ therebetween; when the forks carry the substrates held by the forks to the second substrate containing part, each of the forks moves downward by a predetermined loading stroke amount $ST2$ from a pre-loading position located above a position on which the substrate is to be placed so as to pass the substrate to the second substrate containing part; and the third distance $P3$ between the forks is a value obtained by subtracting the loading stroke amount $ST2$ from the second distance $P2$ between the substrates in the second substrate containing part.

According to the substrate transfer apparatus of the present invention, when the substrates held by the forks are passed to the second substrate containing part, the upper fork of the two adjacent forks of the plurality of forks is horizontally moved forward to a pre-loading position, then the upper fork and the lower fork are simultaneously moved downward so that the substrate held by the upper fork is passed to the second substrate containing part, then the upper fork is horizontally moved rearward and simultaneously therewith the lower fork is horizontally moved forward so that the upper fork is retracted from the second substrate containing part and the lower fork holding the substrate is moved to the pre-loading position, and then the upper fork and the lower fork are simultaneously further moved downward so that the substrate held by the other fork can be passed to the second substrate containing part.

In the step of passing the substrates to the second substrate containing part, the horizontal rearward movement of the upper fork and the horizontal forward movement of the lower fork are simultaneously carried out. Thus, as compared with a case in which a single fork transfers the substrates, a time required for passing the substrates by the wafer transfer apparatus to the second substrate containing part can be shortened. Thus, the wafer transfer apparatus can more rapidly transfer the substrates from the first substrate containing part to the second substrate containing part.

Alternatively, it is preferable that: the second substrate containing part is configured to contain the plurality of substrates that are vertically spaced apart from each other with a second distance $P2$ therebetween; when the forks carry the substrates held by the forks to the second substrate containing part, each of the forks moves downward from a pre-loading position located above a position on which the substrate to be placed so as to pass the substrate to the substrate containing part; and a value of the third distance $P3$ between the forks is substantially equal to a value of the distance P2 between the substrates in the second substrate containing part.

According to the substrate transfer apparatus, when the wafers held in the wafer transfer apparatus are carried to the second substrate containing part, all the forks holding the wafers are simultaneously, horizontally moved forward at first to the corresponding pre-loading positions. Then, all the forks are simultaneously moved downward, so that the wafers held by the forks are carried to the second substrate containing part. Thereafter, all the forks are simultaneously, horizontally moved rearward to be retracted form the second substrate containing part.

In the step for passing the substrates to the second substrate containing part, the horizontal forward movement and the horizontal rearward movement of all the forks are simultaneously carried out. Further, all the substrates held by the forks are collectively carried to the second substrate containing part by means of the one downward movement of the forks. Thus, as compared with the embodiment in which the horizontal rearward movement of the upper fork and the horizontal forward movement of the lower fork are simultaneously carried out, a time required for passing the substrates by the wafer transfer apparatus to the second substrate containing part can be more shortened. Thus, the wafer transfer apparatus can furthermore rapidly transfer the substrates from a first substrate containing part to the second substrate containing part.

The present invention is a substrate transfer apparatus for transferring a substrate from a first substrate containing part for containing a plurality of substrates that are vertically spaced apart from each other with a first distance P1 therebetween to a second substrate containing part for containing a plurality of substrates that are vertically spaced apart from each other with a second distance P2 therebetween, the second distance P2 being larger than the first distance P1, the substrate transfer apparatus comprising: a fork support part capable of vertically moving relative to the first substrate containing part and the second substrate containing part; and a plurality of forks for holding the substrates, that are capable of horizontally moving independently from each other, the forks being disposed on the fork support part in such a manner that: the forks are vertically spaced apart from each other with a predetermined third distance P3 therebetween; when the forks carry the substrates held by the forks to the second substrate containing part, each of the forks moves downward from a pre-loading position located above a position on which the substrate is to be placed so as to pass the substrate to the second substrate containing part; and a value of the third distance P3 is substantially equal to a value of the second distance P2.

According to the substrate transfer apparatus, in the step for passing the substrates to the second substrate containing part, the horizontal forward movement and the horizontal rearward movement of all the forks are simultaneously carried out. Further, all the substrates held by the forks are collectively carried to the second substrate containing part by means of the one downward movement of the forks. Thus, as compared with a case in which a single fork transfers the substrates, a time required for passing the substrates by the wafer transfer apparatus to the second substrate containing part can be shortened. Thus, the wafer transfer apparatus can more rapidly transfer the substrates from the first substrate containing part to the second substrate containing part.

In the substrate transfer apparatus according to the present invention, it is preferable that the substrate transfer apparatus further comprises a single driving part for simultaneously, vertically driving the plurality of forks.

The present invention is a substrate process system comprising: a first substrate containing part for containing a plurality of substrates that are vertically spaced apart from each other with a first distance P1 therebetween; a second substrate containing part for containing a plurality of substrates; and a substrate transfer apparatus for transferring a substrate from the first substrate containing part to the second substrate containing part; wherein the substrate transfer apparatus includes: a fork support part capable of vertically moving relative to the first substrate containing part and the second substrate containing part; and a plurality of forks for holding the substrates, that are capable of horizontally moving independently from each other, the forks being disposed on the fork support part in such a manner that: the forks are vertically spaced apart from each other with a predetermined third distance P3 therebetween; and when the forks take out the substrates from the first substrate containing part, each of the forks lifts the substrate and supports the same by moving upward from a pre-unloading position located below the substrate to be taken out by a predetermined unloading stroke ST1, and values of the third distance P3, the first distance P1, and the unloading stroke amount ST1 are respectively set in such a manner that the third distance P3 is equal to the sum of the first distance P1 and the unloading stroke amount ST1.

The present invention is a substrate process system comprising: a first substrate containing part for containing a plurality of substrate that are vertically spaced apart from each other; a second substrate containing part for containing a plurality of substrates; and a substrate transfer apparatus for transferring a first substrate containing part to a second substrate containing part, including: a fork support part capable of vertically moving relative to the first substrate containing part and the second substrate containing part; and a plurality of forks for holding the substrates, that are capable of horizontally moving independently from each other, the forks being disposed on the fork support part in such a manner that: the forks are vertically spaced apart from each other with a predetermined distance therebetween; when the forks take out the substrates from the first substrate containing part, each of the forks lifts the substrate and supports the same by moving upward by a predetermined unloading stroke amount from a pre-unloading position located below the substrate to be taken out; and a control device for controlling the forks of the substrate transfer apparatus in such a manner that, when the substrates are taken out from the first substrate containing part, the one upper fork of the two adjacent forks of the plurality of forks is horizontally moved forward to the pre-unloading position located below the substrate to be taken out by the one fork, then the one fork and the other fork therebelow are simultaneously moved upward so that the substrate is lifted by the one fork and supported thereon, then the one fork is horizontally moved rearward and simultaneously therewith the other fork is horizontally moved forward so that the one fork holding the substrate is retracted from the first substrate containing part and the other fork is moved to the pre-unloading position located below the substrate to be taken out by the other fork, and then the one fork and the other fork are simultaneously further moved upward so that the substrate is lifted by the other fork and supported thereon.

In the substrate process system according to the present invention, it is preferable that: the second substrate containing part is configured to contain the plurality of substrate that are vertically spaced apart from each other with a second distance P2 therebetween; when the forks carry the substrates held by the forks to the second substrate containing part, each of the forks moves downward by a predetermined loading stroke amount ST2 from a pre-loading position located above a position on which the substrate is to be placed so as to pass the substrate to the second substrate containing part; and values of the third distance P2, the third distance P3, and the unloading stroke amount ST2 are respectively set in such a manner that the second distance P2 is equal to the sum of the third distance P3 and the unloading stroke amount ST2.

Alternatively, it is preferable that the second substrate containing part is configured to contain the plurality of substrates that are vertically spaced apart from each other, and the control device controls the forks of the substrate transfer apparatus in such a manner that, when the substrates held by the forks are passed to the second substrate containing part, the one upper fork of the two adjacent forks of the plurality of forks is horizontally moved forward to a pre-loading position located above a position on which the substrate is to be placed, then the one fork and the other fork are simultaneously moved downward so that the substrate held by the one fork is passed to the second substrate containing part, then the one fork is horizontally moved rearward and simultaneously therewith the other fork is horizontally moved forward so that the one fork is retracted from the second substrate containing part and the other fork holding the substrate is moved to the pre-loading position located above a position on which the substrate is to be placed, and then the one fork and the other fork are simultaneously further moved downward so that the substrate held by the other fork is passed to the second substrate containing part.

Alternatively, in the substrate process system according to the present invention, it is preferable that: the second substrate containing part is configured to contain the plurality of substrates that are vertically spaced apart from each other with a second distance P2 therebetween; when the forks carry the substrates held by the forks to the second substrate containing part, each of the forks moves downward from a pre-loading position located above a position on which the substrate is to be placed so as to pass the substrate to the second substrate containing part; and the second distance P2 and the third distance P3 are respectively set in such a manner that the second distance P2 and the third distance P3 are substantially equal to each other.

Alternatively, it is preferable that the second substrate containing part is configured to contain the plurality of substrates that are vertically spaced apart from each other, and the control device controls the forks of the substrate transfer apparatus in such a manner that, when the substrates held by the forks are passed to the second substrate containing part, all the forks holding the substrates are simultaneously, horizontally moved forward to corresponding pre-loading positions located above positions on which the substrates are to be placed, then all the forks simultaneously moved downward to pass the substrates held by the forks to the second substrate containing part, and then all the forks are simultaneously, horizontally moved rearward so that the forks are respectively retracted from the second substrate containing part.

the present invention is a substrate process system comprising: a first substrate containing part for containing a plurality of substrates that are vertically spaced apart from each other with a first distance P1 therebetween; a second substrate containing part for containing a plurality of substrates that re vertically spaced apart from each other with a second distance P2 therebetween, the second distance P2 being larger than the first distance P1; and a substrate transfer apparatus for transferring a substrate from the first substrate containing part to the second substrate containing part; wherein: the substrate transfer apparatus includes: a fork support part capable of vertically moving relative to the first substrate containing part and the second substrate containing part; and a plurality of forks for holding the substrates, that are capable of horizontally moving independently from each other, the forks being disposed on the fork support part in such a manner that: the forks are vertically spaced apart from each other with a predetermined third distance P3 therebetween; when the forks carry the substrates held by the forks to the second substrate containing part, each of the forks moves downward from a pre-loading position located above a position on which the substrate is to be placed so as to pass the substrate to the second substrate containing part; and the second distance P2 and the third distance P3 are respectively set in such a manner that the second distance P2 and the third distance P3 are substantially equal to each other.

Alternatively, the present invention is a substrate process system comprising: a first containing part for containing a plurality of substrates that are vertically spaced apart from each other with a first distance P1 therebetween; a second substrate containing part for containing a plurality of substrates that are vertically spaced apart from each other with a second distance P2 therebetween, the second distance P2 being larger than the first distance P1; a substrate transfer apparatus for transferring a substrate from the first substrate containing part to the second substrate containing part, including: a fork support part capable of vertically moving relative to the first substrate containing part and the second substrate containing part; and a plurality of forks for holding the substrates, that are capable of horizontally moving independently from each other, the forks being disposed on the fork support part in such a manner that: the forks are vertically spaced apart from each other with a predetermined third distance P3 therebetween; and when the forks carry the substrates held by the forks to the second substrate containing part, each of the forks moves downward from a pre-loading position located above a position on which the substrate is to be placed so as to pass the substrate to the second substrate containing part; and a control device for controlling the forks of the substrate transfer apparatus in such a manner that, when the substrates are one by one taken out from the first substrate containing part and then the substrates held by the forks are passed to the second substrate containing part, all the forks holding the substrates are simultaneously, horizontally moved forward to corresponding pre-loading positions located above positions on which the substrates are to be placed; then all the forks simultaneously moved downward to pass the substrates held by the forks to the second substrate containing part, and then all the forks are simultaneously, horizontally moved rearward so that the forks are respectively retracted from the second substrate containing part.

According to the respective substrate process systems, the respective systems include the above-described substrate transfer apparatuses. Since the substrates are more rapidly transferred from the first substrate containing part to the second substrate containing part, a throughput (process capability) of the substrate process systems can be enhances.

The present invention is a substrate transfer method for transferring a substrate from a first substrate containing part for containing a plurality of substrates that are vertically spaced apart from each other to a second substrate containing part for containing a plurality of substrates, the substrate transfer method comprising the steps of: preparing a plurality of forks for holding substrates, that are capable of horizontally moving independently from each other, the forks being vertically spaced apart from each other with a predetermined distance; when a substrate is taken out from the first substrate containing part, horizontally moving forward one upper fork of two adjacent forks of the plurality of forks to a pre-unloading position located below the substrate to be taken out by the one fork; simultaneously moving the one fork and the other fork therebelow upward so that substrate is lifted by the one fork and supported thereon; horizontally moving the one fork rearward and simultaneously therewith horizontally moving the other fork forward so that the one fork holding the substrate is retracted from the first substrate containing part and the other fork is moved to the pre-unloading position located below the substrate to be taken out by the other fork; and simultaneously moving the one fork and the other fork further upward so the substrate is lifted by the other fork and supported thereon.

In the substrate transfer method according to the present invention, it is preferable that the second substrate containing part is configured to contain the plurality of substrates that are vertically spaced apart from each other, the method further comprising the steps of: when the substrate held by the forks are passed to the second substrate containing part, horizontally moving forward the one upper fork of the two adjacent forks of the plurality of forks to a pre-loading position located above a position on which the substrate is placed; simultaneously moving the one fork and the other fork so that the substrate held by the one fork is passed to the second substrate containing part; horizontally moving the one fork rearward and simultaneously therewith horizontally moving the other fork forward so that the one fork is retracted from the second substrate containing part and the other fork holding the substrate is moved to the pre-loading position located above a position on which the substrate is to be placed; and simultaneously moving the one fork and the other fork further downward so that the substrate held by the other fork is passed to the second substrate containing part.

Alternatively, it is preferable that the second substrate containing part is configured to contain the plurality of substrates that are vertically spaced apart from each other, the method further comprising the steps of: when the substrates held by the forks are passed to the second substrate containing part, simultaneously horizontally moving all the forks holding the substrates to corresponding pre-loading positions located above positions on which the substrates are to be placed; simultaneously moving all the forks downward to pass the substrates held by the forks to the second substrate containing part; and simultaneously horizontally moving all the forks rearward so that the forks are respectively retracted from the second substrate containing part.

The present invention is a substrate transfer method for transferring a substrate from a first substrate containing part for containing a plurality of substrates to a second substrate containing part for containing a plurality of substrates that are vertically spaced apart from each other, the substrate transfer method comprising the steps of: preparing a plurality of forks for holding substrates, that are capable of horizontally moving independently from each other, the forks being vertically spaced apart from each other with a predetermined distance; when a substrate is taken out from the first substrate containing part, taking out the substrates one by one from the first substrate containing part; when the substrate held by the forks are passed to the second substrate containing part, simultaneously horizontally moving all the forks holding the substrates forward to corresponding pre-loading positions located above positions on which the substrates are to be placed; simultaneously moving all the forks downward so that the substrates held by the forks are passed to the second substrate containing part; and simultaneously moving all the forks rearward so that the forks are respectively retracted from the second substrate containing part.

According to the respective substrate transfer methods, the substrates can be more rapidly transferred from the first substrate containing part to the second substrate containing part.

BRIEF DESCRIPTION OF THE DRAWINGS

FIG. 8A is an upper view showing a structure of a fork in the wafer transfer apparatus shown in FIG. 7;

FIG. 8B is a longitudinal sectional view of the fork shown in FIG. 8A taken along the line F-F;

FIG. 9 is a side view of a structure of a transit unit in the substrate process system shown in FIG. 1;

DETAILED DESCRIPTION OF THE INVENTION

First Embodiment

Figure 1:
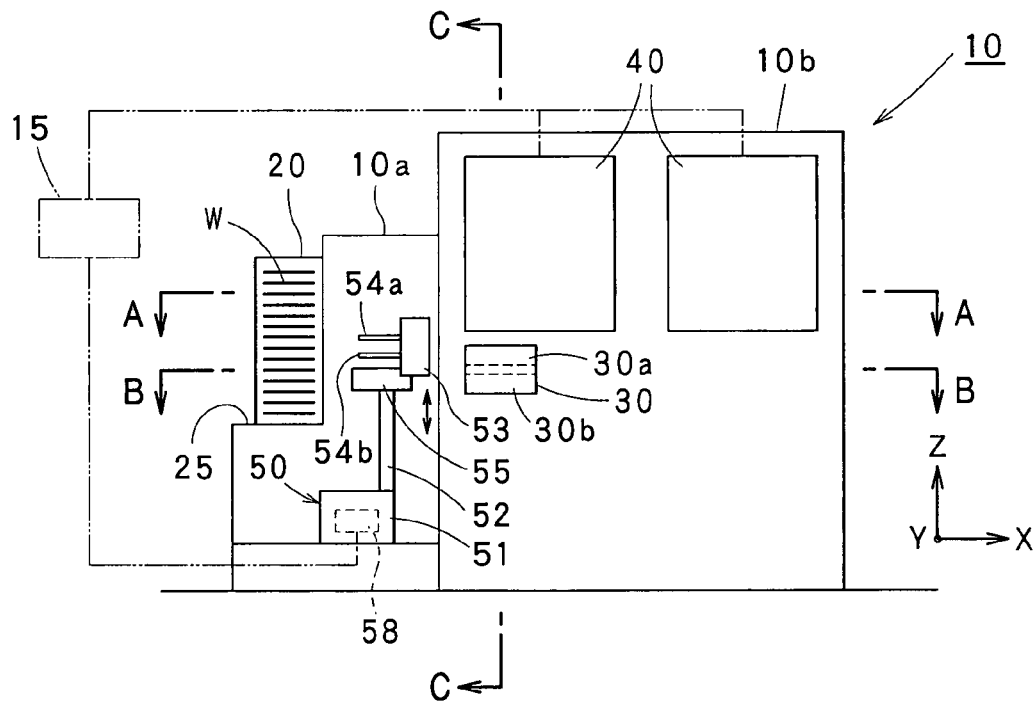
FIG. 1 is a schematic side view of a structure the substrate process system in one embodiment of the present invention.
Figure 2:
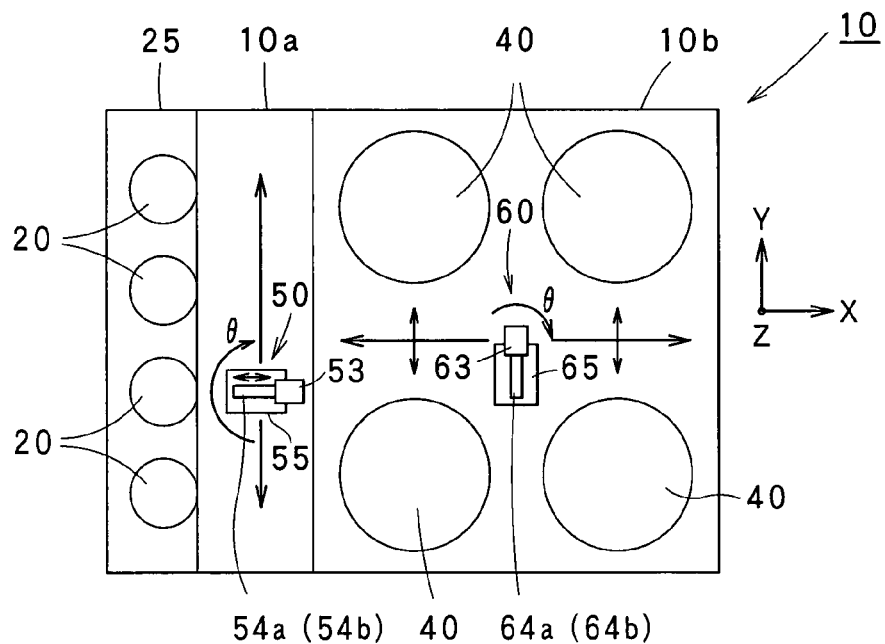
FIG. 2 is a cross-sectional view of the substrate process system shown in FIG. 1 taken along the line A-A.
Figure 3:
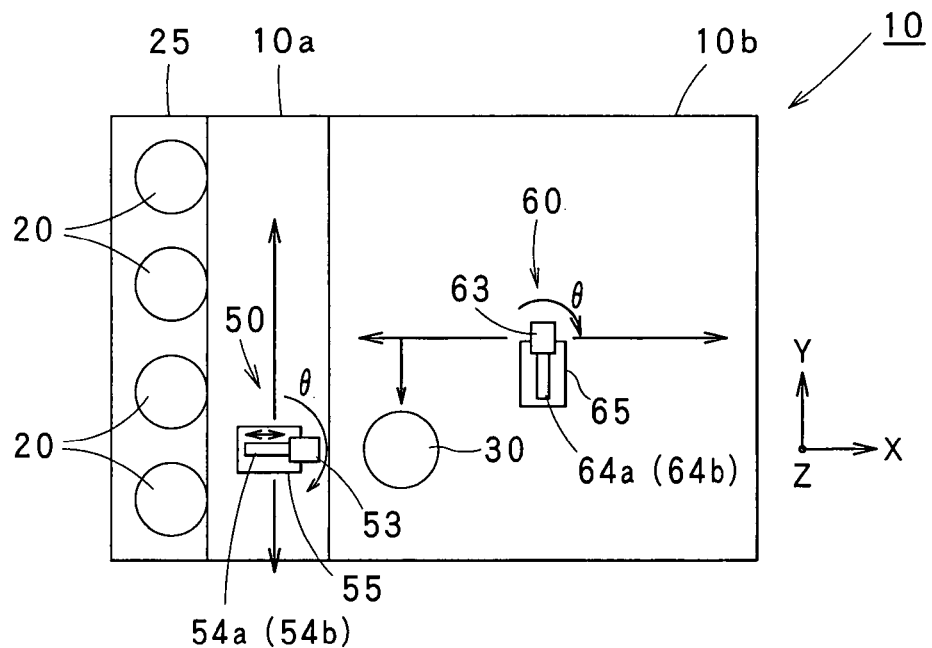
FIG. 3 is a cross-sectional view of the substrate process system shown in FIG. 1 taken along the line B-B.
Figure 4:
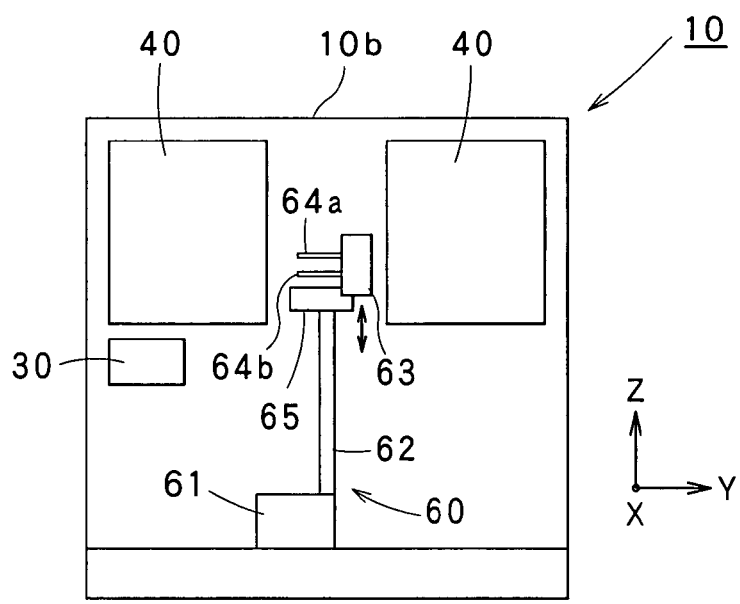
FIG. 4 is a longitudinal sectional view of the substrate process system shown in FIG. 1 taken along the line C-C.

A first embodiment of the present invention will be described below with reference to the accompanying drawings. FIGS. 1 to 12 are views showing the first embodiment of a substrate process system according to the present invention. FIG. 1 is a schematic side view of a structure of the substrate process system in the first embodiment. FIG. 2 is a cross-sectional view of the substrate process system shown in FIG. 1 taken along the line A-A. FIG. 3 is a cross-sectional view of the substrate process system shown in FIG. 1 taken along the line B-B. FIG. 4 is a longitudinal sectional view of the substrate process system shown in FIG. 1 taken along the line C-C. In this embodiment, a semiconductor wafer is used as a substrate.

Figure 5A:
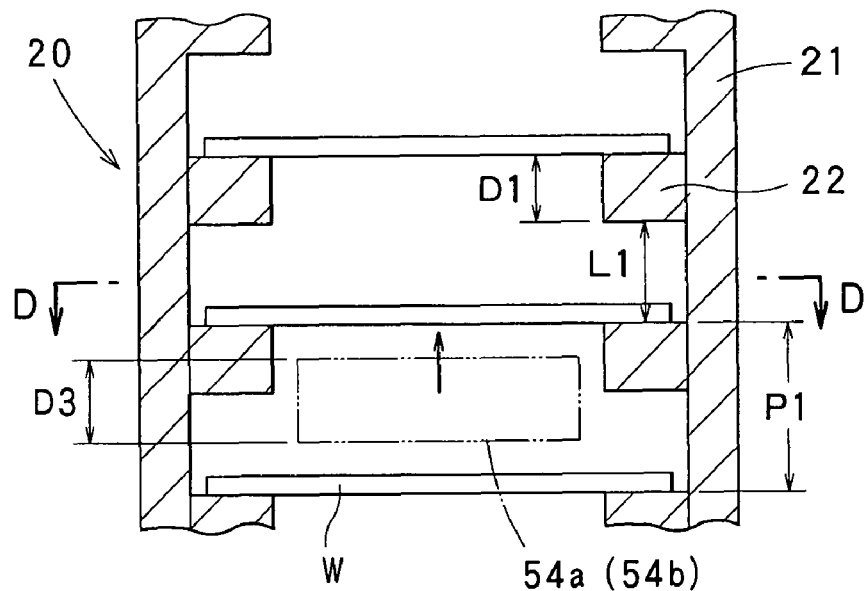
FIG. 5A is a longitudinal sectional view of a FOUP containing wafers of the substrate process system shown in FIG. 1.
Figure 5B:
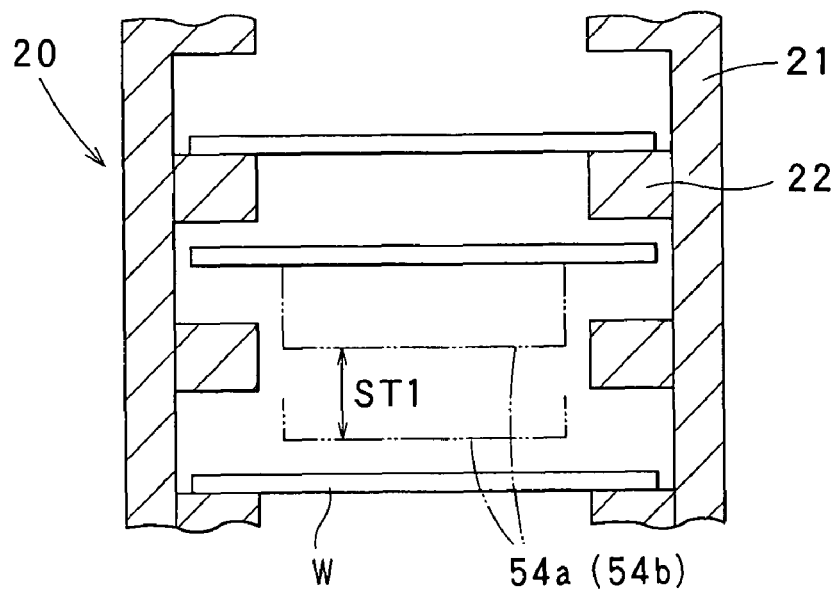
FIG. 5B is a longitudinal sectional view of a state in which one wafer is lifted by a fork of a wafer transfer apparatus in the FOUP shown in FIG. 5A.
Figure 6:
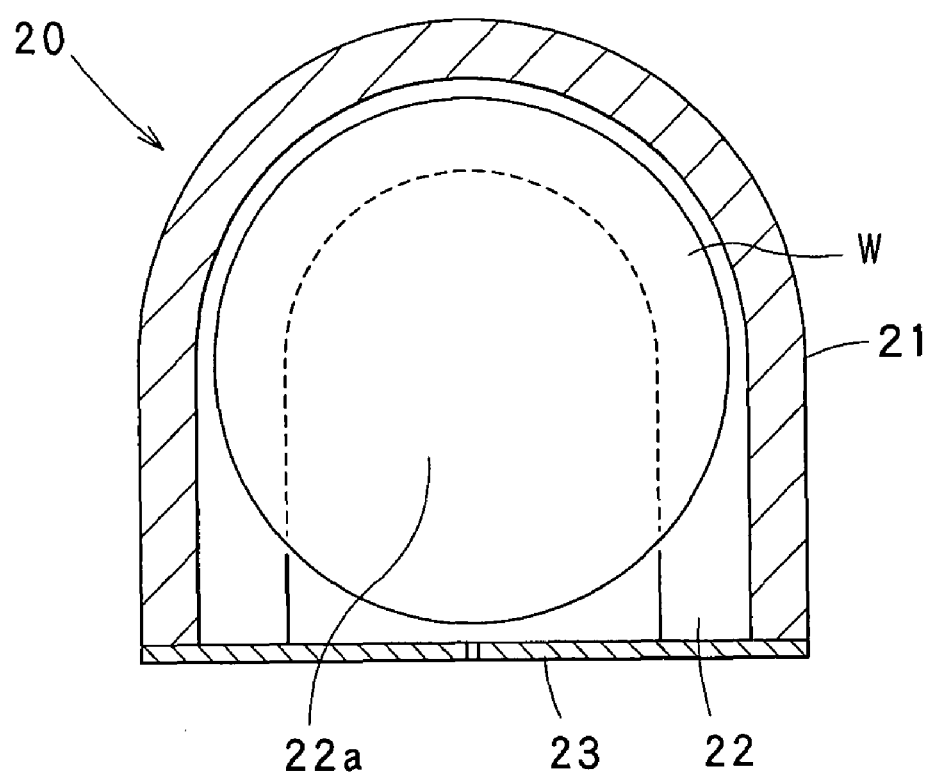
FIG. 6 is a cross-sectional view of the FOUP shown in FIG. 5A taken along the line D-D.

FIG. 5A is a longitudinal sectional view of a FOUP containing wafers of the substrate process system shown in FIG. 1. FIG. 5B is a longitudinal sectional view of a state in which one wafer is lifted by a fork of a wafer transfer apparatus in the FOUP shown in FIG. 5A. FIG. 6 is a cross-sectional view of the FOUP shown in FIG. 5A taken along the line D-D.

Figure 7:
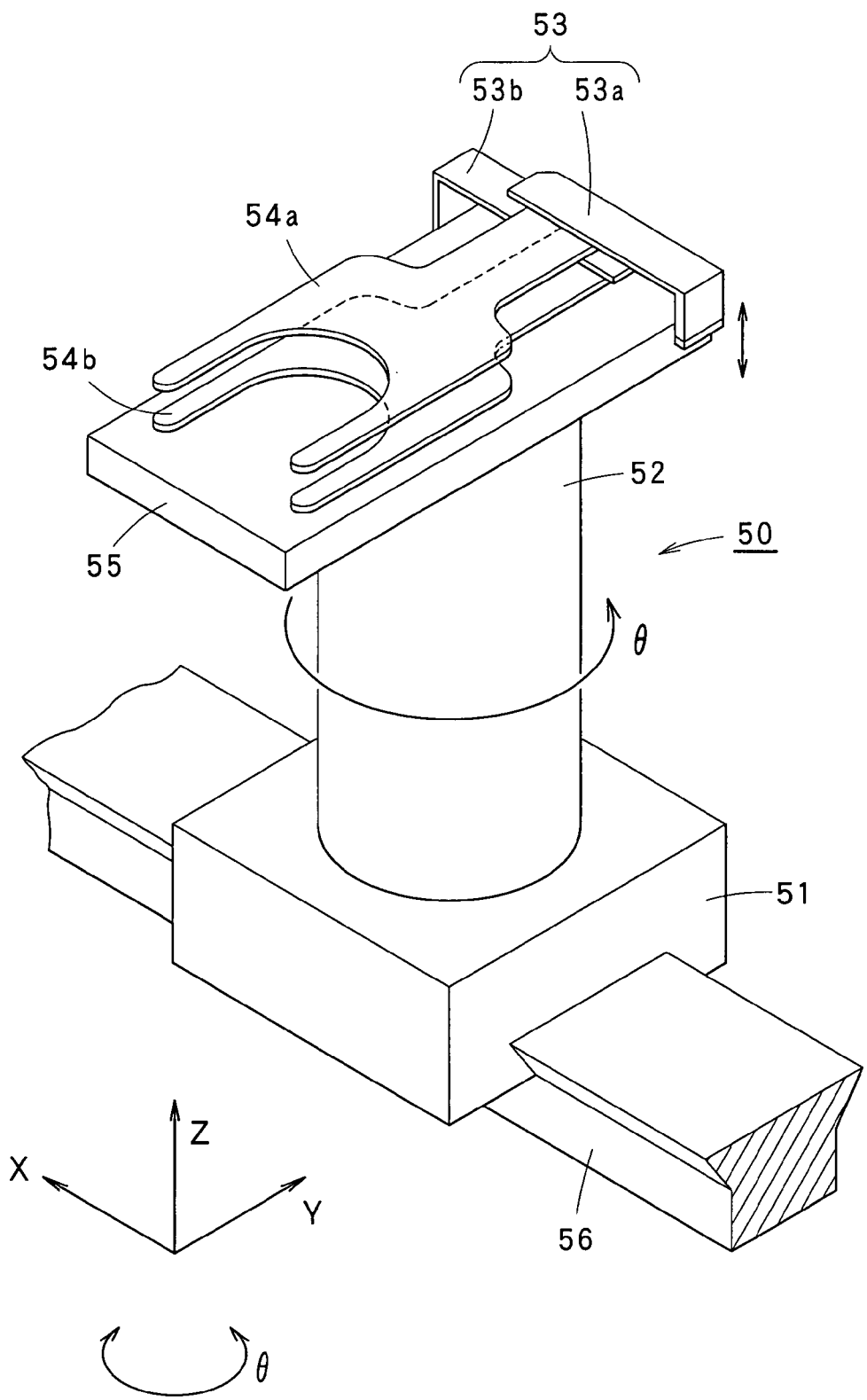
FIG. 7 is a perspective view of a structure of a first wafer transfer apparatus in the substrate process system shown in FIG. 1.

FIG. 7 is a perspective view of a structure of a first wafer transfer apparatus in the substrate process system shown in FIG. 1. FIG. 8A is an upper view showing a structure of a fork in the wafer transfer apparatus shown in FIG. 7. FIG. 8B is a longitudinal sectional view of the fork shown in FIG. 8A taken along the line F-F.

Figure 10A:
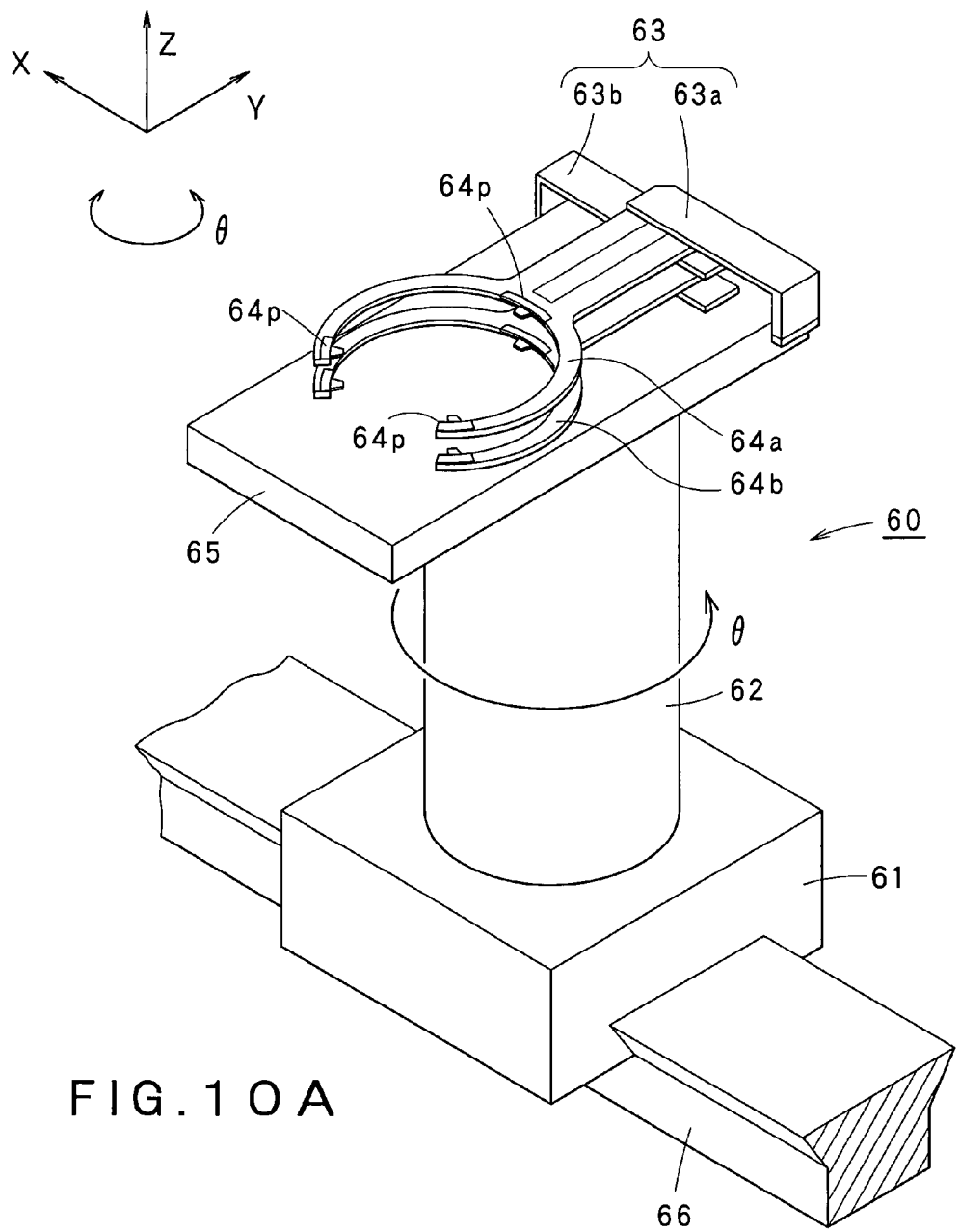
FIG. 10A is a perspective view of a structure of a second wafer transfer apparatus in the substrate process system shown in FIG. 1.
Figure 10B:
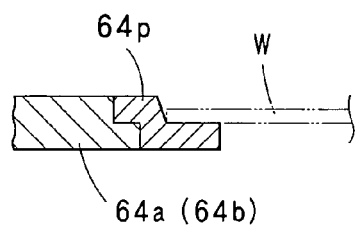
FIG. 10B is a longitudinal sectional view of a fork of the second wafer transfer apparatus shown in FIG. 10A.
Figure 11:
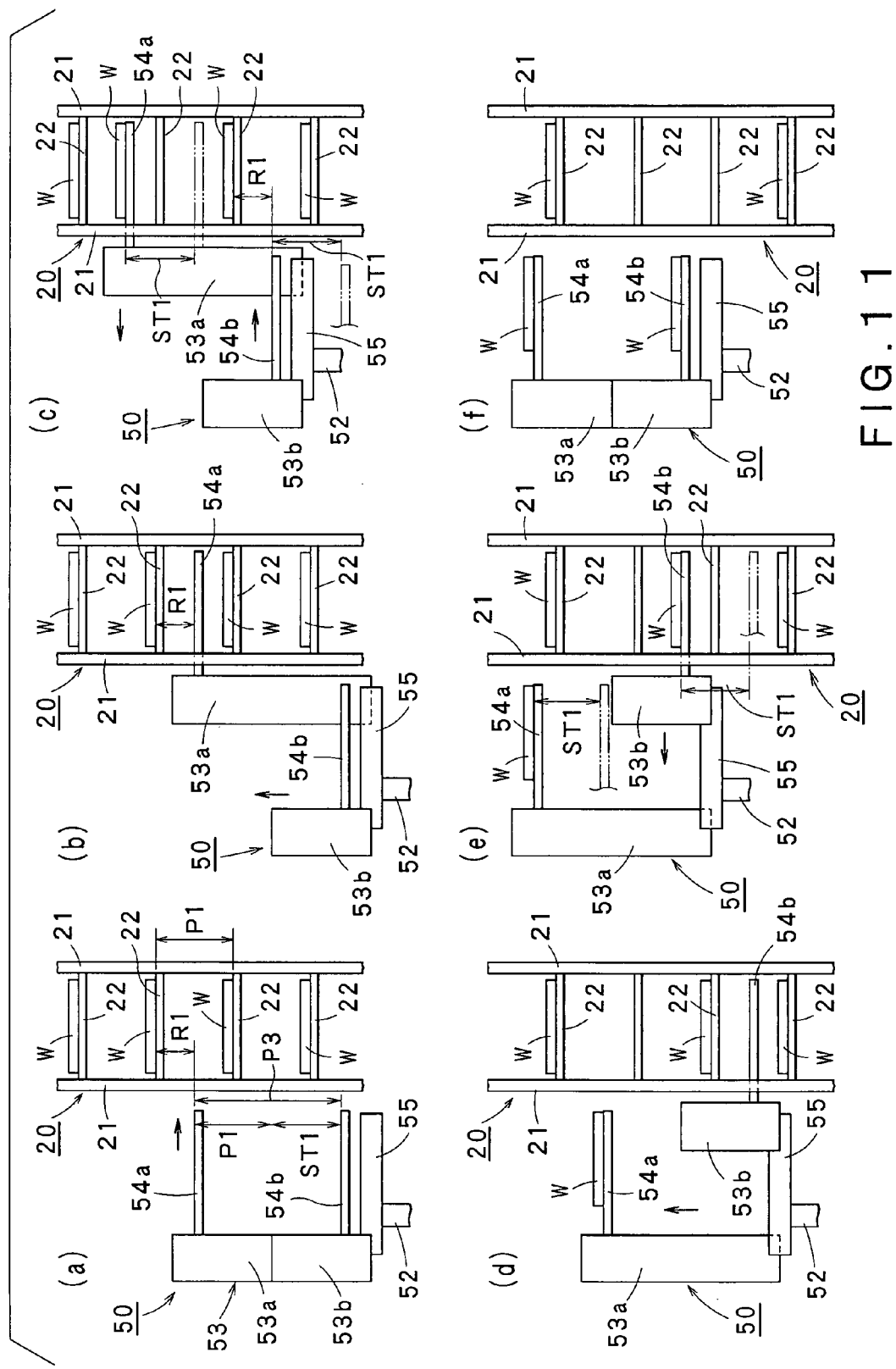
FIGS. 11(a) to 11(f) are schematic consecutive views of a series of operations performed when wafers are taken out from the FOUP by the wafer transfer apparatus in the substrate process system shown in FIG. 1.
Figure 12:
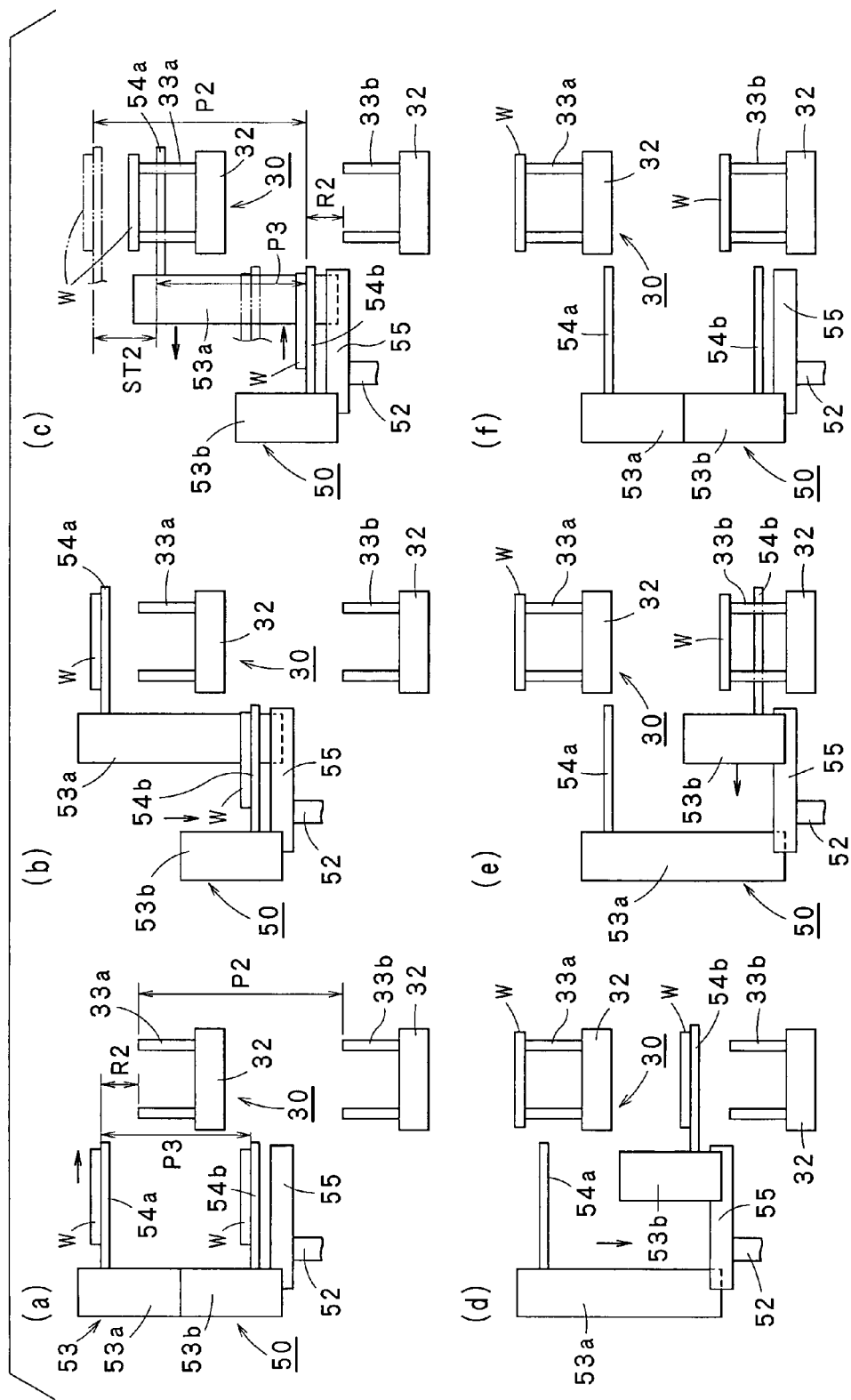
FIGS. 12(a) to 12(f) are schematic consecutive views of a series of operations performed when the wafers are carried from the wafer transfer apparatus to the transit unit in the substrate process system shown in FIG. 1.

FIG. 9 is a side view of a structure of a transit unit in the substrate process system shown in FIG. 1. FIG. 10A is a perspective view of a structure of a second wafer transfer apparatus in the substrate process system shown in FIG. 1. FIG. 10B is a longitudinal sectional view of a fork of the second wafer transfer apparatus shown in FIG. 10A.

FIGS. 11(a) to 11(f) are schematic consecutive views of a series of operations performed when wafers are taken out from the FOUP by the wafer transfer apparatus in the substrate process system shown in FIG. 1. FIGS. 12(a) to 12(f) are schematic consecutive views of a series of operations performed when the wafers are carried from the wafer transfer apparatus to the transit unit in the substrate process system shown in FIG. 1.

Figure 14:
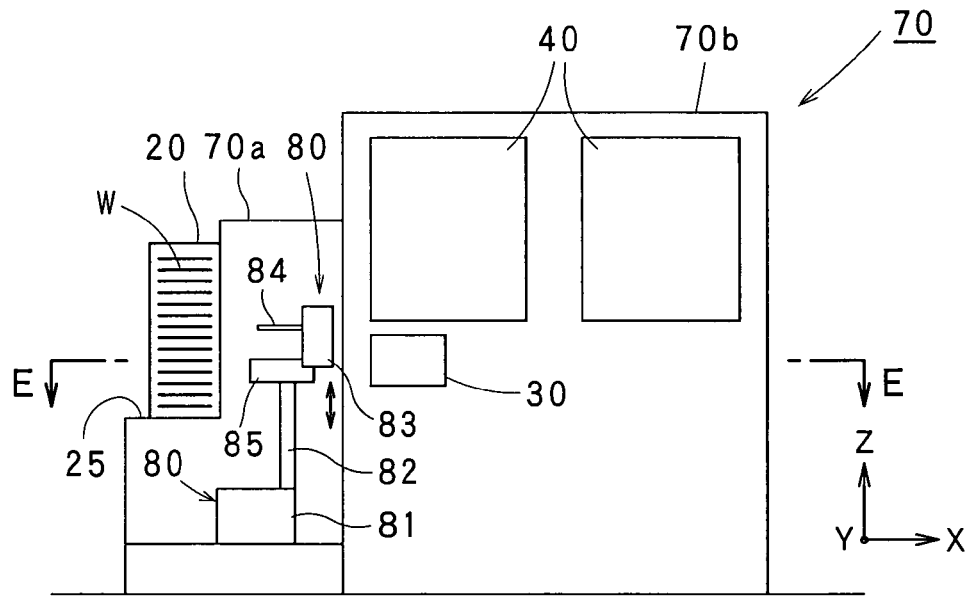
FIG. 14 is a schematic side view of a structure of a conventional substrate process system.
Figure 15:
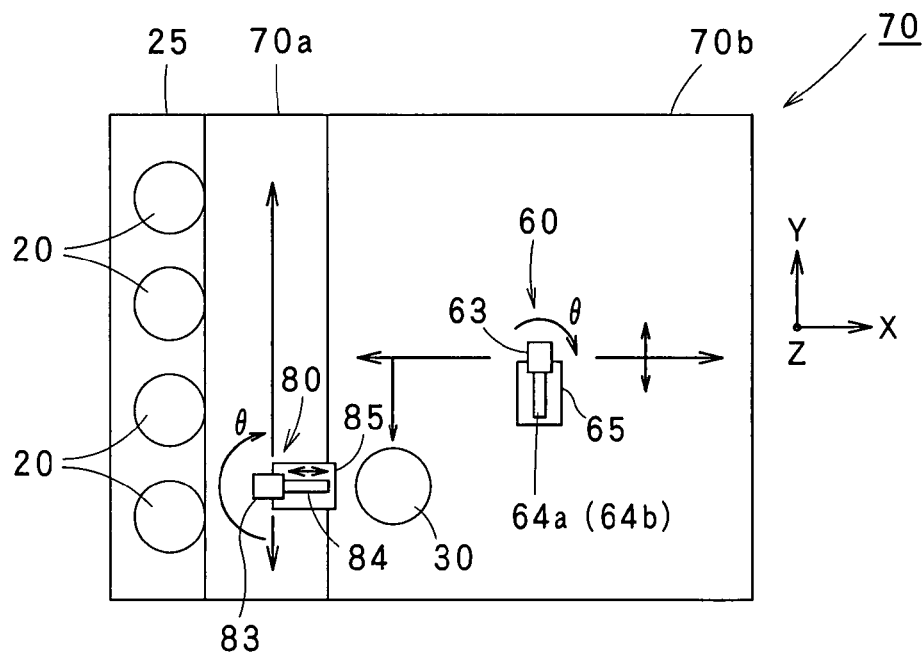
FIG. 15 is a cross-sectional view of the substrate process system shown in FIG. 14 taken along the line E-E.

In FIGS. 1 to 12, the parts having the same structure and function as the conventional substrate process system shown in FIGS. 14 and 15 are shown by the same reference numbers.

A general structure of the substrate process system is described in the first place.

As shown in FIGS. 1 to 4, the substrate process system 10 in the first embodiment includes a carrier station 10a and a process station 10b adjacent to the carrier station 10a. In the carrier station 10a, a semiconductor wafer W (hereafter also referred to as "wafer W") which is not processed yet and/or the wafer W which has been already processed are placed. In the process station 10b, the wafer W is subjected to a cleaning process and a heating process succeeding the cleaning process. The carrier station 10a includes a FOUP (Front opening Unified Pod, wafer storage pod) 20 capable of containing a plurality of, e.g., twenty-five wafers W which are horizontally arranged at predetermined vertical intervals, and a stage 25 on which a plurality of, e.g., four FOUPs 20 can be placed in parallel. The process station 10b includes a transit unit (TRS; Transit Station) 30 in which the wafer W transferred from the FOUP 20 is temporarily placed, and four process chambers (SPIN) 40 of a spin-type to which the wafer W temporarily placed in the transit unit 30 is transferred. In the process chambers 40, the wafer W is subjected to a cleaning process, a drying process, and so on.

In the carrier station 10a, there is disposed a first wafer transfer apparatus (CRA) 50 which can move to transfer the wafer W between the FOUP 20 and the transit unit 30. Similarly, in the process station 10b, there is disposed a second wafer transfer apparatus (PRA) 60 which can move to transfer the wafer W between the transit unit 30 and the process chamber 40. Further, the substrate process system 10 includes a control device 15 that controls the first wafer transfer apparatus 50, the second wafer transfer apparatus 60, the respective process chambers 40, and so on.

A thickness of the wafer W to be processed by the substrate process system 10 in this embodiment is about 1 mm, for example.

Next, the respective constituent elements of the substrate process system 10 are described in detail.

The FOUP 20 placed on the stage 25 is described with reference to FIGS. 5A, 5B, and 6. Each of the FOUPs 20 can contain a plurality of, e.g., twenty-five wafers W which are vertically spaced apart from each other with a first distance P1 (for example, about 10 mm) therebetween. To be specific, the FOUP 20 includes a hollow housing 21 which vertically extends, and a plurality of wafer table members 22 disposed on an inner surface of the housing 21. The wafers W are placed on upper surfaces of the respective wafer table members 22. As shown in FIG. 6, the housing 21 has an open side and thus has a U-shaped cross section. A window opening and/or closing mechanism 23 such as a shutter is disposed on the side opening. When the window opening and/or closing mechanism 23 is opened, the wafer W contained in the FOUP 20 can be taken out therefrom.

As shown in FIG. 5A, the wafer table member 22 is a plate-shape member horizontally fixed on the inner wall of the housing 21. Upper surfaces of the wafer table members 22 are vertically spaced apart from each other with the first distance P1 therebetween. As shown in FIG. 6, the wafer table member 22 has an opening 22a in a center part thereof to define a U-shape. As shown in FIG. 6, the opening 22a is smaller than the wafer W. Thus, a circumference of the wafer W is placed on the upper surface of each of the wafer table members 22.

A thickness D1 of the wafer table member 22 is about 4 mm, for example. Thus, a distance L1 between an upper surface of one wafer table member 22 and a lower surface of the other wafer table member 22 located just above the one wafer table member 22 is about 6 mm, for example.

The transit unit (TRS) 30 is described with reference to FIG. 9. The transit unit 30 can contain a plurality of, e.g., eight wafers W which are vertically spaced apart from each other with a second distance P2 (for example, about 26 mm) therebetween. As shown in FIG. 1, the transit unit 30 is divided into two regions, i.e., a lower region 30b in which four unprocessed wafers W, which are to be sent to the process chamber 40, can be contained, and an upper region 30a in which four processed wafers W, which have been sent from the process chamber 40, can be contained.

A structure of the transit unit 30 is concretely described. As shown in FIG. 9, the transit unit 30 includes a housing 31 which vertically extends and has an opening formed in a side surface thereof; a plurality of partition members 32 of a substantially disc-like shape, which are fixed on an inner surface of the housing 31; and a plurality of, e.g., three projection members 33 (FIG. 9 shows only two of the three projection members 33) disposed on an upper surface of each of the partition members 32 to project upward. As shown in FIG. 9, lower surfaces of the adjacent partition member 32 are vertically spaced apart from each other with a second distance P2 therebetween. A value of the distance P2 is described hereinbelow. As shown in FIG. 9, the projection member 33 is a bar member projecting upward from the upper surface of the partition member 32. As shown in FIGS. 8A and 8B (described below) and FIG. 9, the projection members 33 are positioned on respective points of an imaginary equilateral triangle whose center of gravity is a center point of the substantially circular partition member 32. Thus, a center part of a lower surface of the wafer W is supported by the projection members 33.

A thickness D2 of each of the partition members 32 is about 5 mm, for example, and a vertical height L2 of each of the projection members 33 is about 14 mm, for example.

Each of the process chambers (SPIN) 40 of a spin-type cleans and dries the wafer W while the wafer W is being rotated.

The first wafer transfer apparatus 50 carries the wafer W between the FOUP 20 and the transit unit 30. A structure of the first wafer transfer apparatus 50 is described in detail below.

As shown in FIG. 7, the first wafer transfer apparatus 50 includes a base member 51 which runs along a rail 56 extending in the Y direction in FIG. 2, and a vertical moving mechanism 52 disposed on an upper surface of the base member 51, the vertical moving mechanism 52 being elongatable and compressible in the Z direction. A support base 55 is disposed on an upper part of the vertical moving mechanism 52. A fork support member 53 is fixed to the support base 55. The fork support member 53 supports a pair of forks 54a and 54b each for holding the wafer W.

As shown in FIG. 7, the vertical moving mechanism 52 can rotate in the θ direction relative to the base member 51. That is, the support base 55 can move in the Y direction and the Z direction and can rotate in the θ direction. The pair of forks 54a and 54b are stacked above the support base 55. The fork support member 53 has horizontal moving mechanisms 53a and 53b on which the pair of forks 54a and 54b are fixed through proximal parts thereof. The horizontal moving mechanisms 53a and 53b can move the forks 54a and 54b, respectively, in the X direction in FIG. 7.

That is, the pair of forks 54a and 54b are integrally disposed on the support base 55 through the fork support member 53, and the vertical moving mechanism 52 vertically moves the support base 55. Thus, the vertical moving mechanism 52 can be used as a single driving part for vertically driving the pair of forks 52a and 52b at the same time. Due to the provision of the single driving part for vertically moving the pair of forks 52a and 52b at the same time, a driving mechanism can be made simple, as compared with a driving mechanism which drives the forks 52a and 52b independently in the Z-axis direction.

The first wafer transfer apparatus 50 further includes a controller 58. The controller 58 controls the vertical moving mechanism 52 and the horizontal moving mechanisms 53a and 53b of the fork support member 53, whereby the operations of the respective forks 52a and 52b can be independently controlled. As shown in FIG. 1, the controller 58 is connected to the control device 15 of the substrate processing system 10, and control signals are sent from the control device 15. Although FIG. 1 shows that the controller 58 is built in the first wafer transfer apparatus 50 by way of example, the controller 58 may be disposed outside the first wafer transfer apparatus 50. Alternatively, the controller 58 may be omitted, and the control device 15 in place of the controller 58 may directly control the operations of the forks 52a and 52b of the first wafer transfer apparatus 50. Details of the controls of the controller 58 are described hereafter.

The pair of forks 54a and 54b are supported by the fork support member 53 such that the forks 54a and 54b are vertically spaced apart from each other with a predetermined third distance P3 therebetween. Relative to the fork support member 53, the respective forks 54a and 54b can be horizontally moved independently from each other by the horizontal moving mechanisms 53a and 53b. When the forks 54a and 54b are horizontally moved, the third distance P3 between the forks 54a and 54b is kept constant. A thickness D3 of each of the forks 54a and 54b is about 6 mm, for example (see, FIGS. 5A and 5B).

Shapes of the respective forks 54a and 54b are concretely described. As shown in FIG. 8A, each of the forks 54a and 54b has a distal part of a substantially U-shape, and a proximal part connected to the fork support member 53. As shown in FIG. 8A, the wafer W (depicted by two-dot chain lines in FIG. 8A) is supported by the distal part of a substantially U-shape. An opening of the distal part allows passage of the three projection members 33 (depicted by two-dot chain lines in FIG. 8A) of the transit unit 30. The distal part can pass through the U-shaped opening 22a (see, FIG. 6) of the wafer table members 22 in the FOUP 20. As shown in FIG. 8B, a plurality of, e.g., three holding members 54p for holding peripheral parts of the wafer W and positioning the same are attached on a surface of each of the forks 54a and 54b.

The fork 54a (54b) supports the wafer W from a rear surface thereof, and holds the wafer W by the holding members 54p engaging with the peripheral parts of the wafer W.

How the fork 54a (54b) takes out the wafer W from the FOUP 20 is described. At first, the fork 54a (54b) is moved to a pre-unloading position which is located below the wafer W to be taken out (see, FIG. 5A). Then, the support base 55 is moved upward by a predetermined unloading stroke amount ST1 to thereby move the fork 54a (54b) upward from the pre-unloading position by the unloading stroke amount ST1. In the course of the upward movement of the fork 54a (54b), the fork 54a (54b) lifts the wafer W placed on the wafer table member 22 of the FOUP 20, so that the wafer W is passed to the upper surface of the fork 54a (54b).

An amount of the unload ST1 is previously set based on a structure of the FOUP 20. Concretely, a height level of the pre-unloading position is determined in view of the following facts. That is to say, the thickness D3 of the fork 54a (54b) is relatively large (for example, about 6 mm). When the fork 54a (54b) is moved to a position below the wafer W to be taken out, predetermined gaps (for example, not less than 1 mm), i.e., an upper gap between the fork 54a (54b) and the wafer W positioned thereabove, and a lower gap between the fork 54a (54b) and the wafer W positioned therebelow, have to be maintained. Thus, the height level of the pre-unloading position is logically determined based on the structure of the FOUP 20. A height level of the fork 54a (54b) when the fork 54a (54b) holding the wafer W is drawn from the FOUP 20 is determined such that the wafer W held on the fork 54a (54b) does not collide with the wafer table member 22 positioned above the wafer W and the wafer table member 22 positioned below the wafer W (FIG. 5B). Thus, a value of the unloading stroke amount ST1, which is equivalent to a value obtained by subtracting the height level of the fork 54a (54b) on the pre-unloading position from the height level of the fork 54a (54b) when it is drawn from the FOUP 20, is logically determined. To be more precise, the unloading stroke amount ST1 is about 6.5 mm, for example.

The third distance P3 between the forks 54a and 54b is set to be equal to the sum of the first distance P1 between the wafers in the FOUP 20 and the unloading stroke amount ST1. In concrete terms, since the first distance P1 is about 10 mm, and the unloading stroke amount ST1 is about 6.5 mm, the third distance P3 is set about 16.5 mm.

Next, how the forks 54a and 54b holding the wafers W carry the wafers W to the transit unit 30 is described. At first, the fork 54a (54b) is moved to a pre-loading position which is located above a position on which the wafer is to be placed. Then, the support base 55 is moved downward by a predetermined loading stroke amount ST2 to thereby move the fork 54a (54b) downward from the pre-loading position by the loading stroke amount ST2. In the course of the downward movement of the fork 54a (54b), top portions of the projection members 33 of the transit unit 30 come in contact with the bottom surface of the wafer W held on the fork 54a (54b), so that the wafer W is carried to the transit unit 30.

The loading stroke amount ST2 and the second distance P2 between the wafers W in the transit unit 30 are respectively set such that the second distance P2 is equal to the sum of the third distance P3 and the loading stroke amount ST2. More concretely, when the third distance P3 is about 16.5 mm, the second distance P2 is set equal to or more than about 23 mm, and the loading stroke amount ST2 is set equal to or more than about 6.5 mm. Given in the following description as an example to describe the substrate processing system 10 in a case where the second distance P2 is set about 23 mm, and the loading stroke amount ST2 is set about 6.5 mm.

As described above, the second wafer transfer apparatus (PRA) 60 carries the wafer W between the transit unit 30 and the process chambers 40 in the process station 10b. A structure of the second wafer transfer apparatus 60 is described in detail below.

As shown in FIG. 10A, the second wafer transfer apparatus 60 includes a base member 61 which runs along a rail 66 extending in the X direction in FIG. 2, and a vertical moving mechanism 62 disposed on an upper surface of the base member 61, the vertical moving mechanism 62 being elongatable and compressible in the Z direction. A support base is disposed on an upper part of the vertical moving mechanism 62. A fork support member 63 is fixed to the support base 65. The fork support member 63 supports a pair of forks 64a and 64b each for holding the wafer W.

As shown in FIG. 10A, the vertical moving mechanism 62 can rotate in the θ direction relative to the base member 61. That is, the support base can move in the X direction and the Z direction and can rotate in the θ direction. The pair of forks 64a and 64b are stacked above the support base. The fork support member 63 has horizontal moving mechanisms 63a and 63b on which the pair of forks 64a and 64b are fixed through proximal parts thereof. The horizontal moving mechanisms 63a and 63b can move the forks 64a and 64b, respectively, in the Y direction in FIG. 10A.

As shown in FIG. 10B, a plurality of, e.g., three holding members 64p for holding peripheral parts of the wafer W and positioning the same are attached on a surface of each of the forks 64a and 64b. As described above, since the second wafer transfer apparatus 60 transfers the wafer W at a velocity higher than the first wafer transfer apparatus 50 does, the forks 64a and 64b should hold the wafers W more securely. In order thereto, the thickness of the holding member 64p of the second wafer transfer apparatus 60 is required to be larger than that of the holding member 54p of the first wafer transfer apparatus 50. Thus, the second distance P2 between the wafers W in the second wafer transfer apparatus 60 is generally larger than the first distance P1 between the wafers in the first wafer transfer apparatus 50.

Next, effects of the substrate process system 10 as structured above are described. A general operation of the substrate process system 10 is described in the first place.

At first, the FOUP 20 containing, for example, twenty-five wafers W to be processed is placed on the stage 25. Then, the window opening and/or closing mechanism 23 in the FOUP 20 is opened to make it possible that the wafer W contained in the FOUP 20 is taken out therefrom. The first wafer transfer apparatus 50 approaches the FOUP 20, and the fork 54a (54b) of the wafer transfer apparatus 50 lifts the wafer W and holds the same. At this time, the two wafers W adjacent to each other in the FOUP 20 are taken out therefrom by the pair of forks 54a and 54b. Details of an operation of the first wafer transfer apparatus 50 when it takes out the wafer W from the FOUP 20 are described below.

Then, the wafers W held on the forks 54a and 54b of the first wafer transfer apparatus 50 are carried to the transit unit 30. An operation of the first wafer transfer apparatus 50 is controlled by the control device 15. To be specific, in the carrier station 10a, the first wafer transfer apparatus 50 moves horizontally and rotates to come close to the transit unit 30. The fork 54a (54b) horizontally moves forward, and the support base 55 moves downward, whereby the wafer W is carried from the fork 54a (54b) onto the projection members 33 of the transit unit 30. In this case, the wafer W is received in the lower region 30b of the transit unit 30. Details of an operation of the wafer W carried from the first wafer transfer apparatus 50 to the transit unit 30 are described below.

Thereafter, the second wafer transfer apparatus 60 approaches the transit unit 30, and the lower fork 64b of the second wafer transfer apparatus 60 lifts the wafer W held on the projection members 33 of the transit unit 30, and holds the wafer W. Then, the second wafer transfer apparatus 60 comes close to the process chamber 40, with the wafer W being held by the lower fork 64b, so as to bring the wafer W held by the lower fork 64b into the process chamber 40. An operation of the second wafer transfer apparatus 60 is controlled by the control device 15.

Following thereto, the wafer W is subjected to a cleaning process and a drying process in the process chamber 40. Details of the cleaning process and the drying process are omitted.

After the wafer W is cleaned and dried, the wafer W is again delivered to the second wafer transfer apparatus 60, and is brought into the transit unit 30. At this time, the wafer W is held by the upper fork 64a of the second wafer transfer apparatus 60, and is received in the upper region 30a of the transit unit 30.

Thereafter, the wafer W sent to the transit unit 30 is delivered to the first wafer transfer apparatus 50, and is again sent to the FOUP 20. Specifically, in the carrier station 10a, the first wafer transfer apparatus 50 moves horizontally and rotates to come close to the transit unit 30. The fork 54a (54b) horizontally moves forward, and the support base 55 moves upward, whereby the wafer W held on the projection members 33 of the transit unit 30 is lifted by the fork 54a (54b) and held thereon. After that, the wafer W held on the fork 54a (54b) of the first wafer transfer apparatus 50 are carried to the FOUP 20.

In this manner, a series of processes for the wafer W in the substrate process system 10 is completed.

Next, a series of operations for taking out from the FOUP 20 two wafers W which are vertically adjacent to each other by the first wafer transfer apparatus 50 are described in detail, with reference to FIGS. 11(a) to 11(f). The series of operations are performed by the vertical moving mechanism 52 and the horizontal moving mechanisms 53a and 53b that are controlled by the controller 58 built in the first wafer transfer apparatus 50.

As shown in FIG. 11(a), the first wafer transfer apparatus 50 approaches the FOUP 20, at first. Before this movement, the support base 55 is vertically moved such that a height level of the upper fork 54a is equal to the height level of the pre-unloading position shown in FIG. 5A. When the height level of the upper fork 54a is equal to the height level of the pre-unloading position, a distance R1 between the bottom surface of the one wafer W to be taken out by the upper fork 54a and the upper surface of this upper fork 54a is smaller than the unloading stroke amount ST1.

Then, the upper fork 54a is horizontally moved forward, as shown in FIG. 11(b), to the pre-unloading position which is located just below the one wafer W to be taken out by the upper fork 54a. At this time, the lower fork 54b is kept unmoved, and thus the lower fork 54b is spaced apart from the FOUP 20.

Then, as shown in FIG. 11(c), the support base 55 is moved upward by the unloading stroke amount ST1. Since the upper fork 54a is moved upward by the unloading stroke amount ST1, the upper fork 54a lifts the one wafer W held on the wafer table member 22 of the FOUP 20 from the rear surface of the one wafer W, and the upper fork 54a holds the one wafer W.

The lower fork 54b also moves upward by the unloading stroke amount ST1. Since the third distance P3 is equal to the sum of the first distance P1 and the unloading stroke amount ST1, the bottom surface of the other wafer W located just below the one wafer W to be taken out by the upper fork 54a and the upper surface of the lower fork 54b is equal to the distance R1 (see, FIGS. 11(a) and 11(c)). Thus, the lower fork 54b is automatically moved to a position whose height level is equal to that of the pre-unloading position.

Then, the upper fork 54a is horizontally moved rearward, and simultaneously the lower fork 54b is horizontally moved forward. Thus, as shown in FIG. 11(d), the upper fork 54a holding thereon the wafer W is retracted from the FOUP 20, and the lower fork 54b moves to the pre-unloading position which is located just below the other wafer W to be taken out by the lower fork 54b.

Then, as shown in FIG. 11(e), the support base 55 is further moved upward by the unloading stroke amount ST1. Since the lower fork 54b is moved upward by the unloading stroke amount ST1, the lower fork 54b lifts the other wafer W held on the wafer table member 22 of the FOUP 20 from the rear surface of the other wafer W, and the lower fork 54b holds the other wafer W.

Finally, the lower fork 54b is horizontally moved rearward. Thus, as shown in FIG. 11(f), the lower fork 54b is retracted from the FOUP 20. In this manner, the series of operations of the first wafer transfer apparatus 50 for taking out from the FOUP 20 two wafers W which are vertically adjacent to each other is completed.

When the wafers W are returned from the transit unit 30 to the FOUP 20, a series of operations for carrying the two wafers W held by the first wafer transfer apparatus 50 to the FOUP 20 are performed in the order (in the order shown in FIGS. 11(f) to 11(a)) which is reverse to the series of operations shown in FIGS. 11(a) to 11(f).

Next, details of a series of operations for carrying the two wafers W held by the first wafer transfer apparatus 50 to the transit unit 30 are described with reference to FIGS. 12(a) to 12(f).

As shown in FIG. 12(a), the first wafer transfer apparatus 50 approaches the transit unit 30, at first. Before this movement, the support base 55 is vertically moved such that a height level of the upper fork 54a is equal to the height level of the pre-loading position. The pre-loading position is a position just above a location on which the wafer W held by the fork 54a (54b) is to be placed. From this pre-loading position, the fork 54a (54b) starts a downward movement for passing the wafer from the fork 54a (54b) to the projection members 33a (33b) of the transit unit 30. When the height level of the upper fork 54a is equal to the height level of the pre-loading position, a distance R2 between the bottom surface of the one wafer W held by the upper fork 54a and the one projection member 33a of the transit unit 30 is smaller than the loading stroke amount ST2.

Then, the upper fork 54a is horizontally moved forward, as shown in FIG. 12(b), to the pre-loading position. At this time, the lower fork 54b is kept unmoved, and thus the lower fork 54b is spaced apart from the transit unit 30.

Then, as shown in FIG. 12(c), the support base 55 is moved downward by the loading stroke amount ST2. Since the upper fork 54a is moved downward by the loading stroke amount ST2, the one wafer W with its rear surface supported by the upper fork 54a is passed to the one projection members 33a of the transit unit 30.

The lower fork 54b also moves downward by the loading stroke amount ST2. Since the second distance P2 is equal to the sum of the third distance P3 and the loading stroke amount ST2, a distance between the bottom surface of the other wafer W held by the lower fork 54b and the other projection member 33b of the transit unit 30 is equal to the distance R2 (see, FIGS. 12(a) and 12(c)). Thus, the lower fork 54b is automatically moved to a position whose height level is equal to that of the pre-loading position.

Then, the upper fork 54a is horizontally moved rearward, and simultaneously the lower fork 54b is horizontally moved forward. Thus, as shown in FIG. 12(d), the upper fork 54a is retracted from the transit unit 30, and the lower fork 54b moves to the pre-loading position which is located just above the other projection member 33b.

Then, as shown in FIG. 12(e), the support base 55 is further moved downward by the loading stroke amount ST2. Since the lower fork 54b is moved downward by the loading stroke amount ST2, the other wafer W with its rear surface supported by the lower fork 54b is passed to the other projection member 33a of the transit unit 30.

Finally, the lower fork 54b is horizontally moved rearward. Thus, as shown in FIG. 12(f), the lower fork 54b is retracted from the transit unit 30. In this manner, the series of operations for carrying the two wafers W held by the first wafer transfer apparatus 50 to the transit unit 30 is completed.

When the wafers W are returned from the transit unit 30 to the FOUP 20, a series of operations for taking out the wafers W from the transit unit 30 by the first wafer transfer apparatus 50 are performed in the order (in the order shown in FIGS. 12(a) to 12(F)) which is reverse to the series of operations shown in FIGS. 12(a) to 12(f).

As described above, according to the wafer transfer apparatus 50 in this embodiment, the forks 54a and 54b are disposed on the fork support member 53 such that the forks 54a and 54b are vertically spaced apart from each other with the predetermined third distance P3 therebetween. When the wafer W is taken out from the FOUP 20 by the fork 54a (54b), the fork 54a (54b) is moved upward by the predetermined unloading stroke amount ST1 from the pre-unloading position located below the wafer W, so that the wafer W is lifted by the fork 54a (54b) and supported thereon. The third distance P3 is set equal to the sum of the first distance P1 between the wafers W contained in the FOUP 20 and the unloading stroke amount ST1.

Thus, when the wafer transfer apparatus 50 takes out the wafers W from the FOUP 20, the upper fork 54a of the two adjacent forks 54a and 54b is horizontally moved forward to the pre-unloading position at first, and then the upper fork 54a and the lower fork 54b are simultaneously moved upward so that the wafer W is lifted by the upper fork 54a and supported thereon. Thereafter, the upper fork 54a is horizontally moved rearward to be retracted from the FOUP 20. Simultaneously therewith, the lower fork 54b is horizontally moved forward to the pre-unloading position. After that, the upper fork 54a and the lower fork 54b are further moved upward at the same time, and the wafer W is lifted by the lower fork 54b lifts and supported thereon.

In the step of taking out the wafers W from the FOUP 20, the horizontal rearward movement of the upper fork 54a and the horizontal forward movement of the lower fork 54b are simultaneously carried out. Thus, as compared with a case in which a single fork transfers the wafers W, a time required for taking out the wafers W by the wafer transfer apparatus 50 from the FOUP 20 can be shortened. In addition, the two adjacent forks 54a and 54b of the wafer transfer apparatus 50 can take out the two wafers W which are vertically adjacent to each other in the FOUP 20. Thus, the wafers W can be sequentially taken out from the FOUP 20 from above or from below thereof.

When the wafers W held on the forks 54a and 54b are carried to the transit unit 30, the fork 54a (54b) is moved downward by the predetermined loading stroke amount ST2 from the pre-loading position which is located above a location on which the wafer W is placed, so that the wafer W is passed to the transit unit 30. The third distance P3 between the forks 54a and 54b is equal to a value obtained by subtracting the loading stroke amount ST2 from the second distance P2 between the wafers W in the transit unit 30.

When the wafers W held by the wafer transfer apparatus 50 are carried to the transit unit 30, the upper fork 54a of the two adjacent forks 54a and 54b is horizontally moved forward to the pre-loading position at first, and then the upper fork 54a and the lower fork 54b are simultaneously moved downward so that the wafer W held on the upper fork 54a is passed to the transit unit 30. Thereafter, the upper fork 54a is horizontally moved rearward to be retracted from the transit unit 30. Simultaneously therewith, the lower fork 54b is horizontally moved forward to the pre-loading position. After that, the upper fork 54a and the lower fork 54b are further moved downward at the same time, and the wafer W held by the lower fork 54b is carried to the transit unit 30.

In the step of carrying the wafers W to the transit unit 30, the horizontal rearward movement of the upper fork 54a and the horizontal forward movement of the lower fork 54b are simultaneously carried out. Thus, as compared with a case in which a single fork transfers the wafers W, a time required for carrying the wafers W by the wafer transfer apparatus 50 to the transit unit 20 can be shortened. Thus, the wafer transfer apparatus 50 can more rapidly transfer the wafers W from the FOUP 20 to the transit unit 30.

The substrate process system 10 in this embodiment includes the above-described wafer transfer apparatus 50. Thus, the wafers W can be more rapidly transferred from the FOUP 20 to the transit unit 30 to thereby enhance a throughput (process capability) of the substrate process system 10.

The substrate process system 10 is not limited to the above embodiment, and various changes and modifications can be made. For example, the number of forks of the first wafer transfer apparatus 50 is not limited to two. The first wafer transfer apparatus 50 may include more than two forks. In this case, the forks are disposed on the fork support member 53 such that the forks are vertically spaced apart from each other with the predetermined third distance P3 therebetween. When the forks take out the wafers W from the FOUP 20, the uppermost fork takes out the wafer W from the FOUP 20 at first. Then, the uppermost fork horizontally moves rearward and simultaneously therewith the second uppermost fork moves forward to take out the wafer W from the FOUP 20. Then, the second uppermost fork horizontally moves rearward and simultaneously therewith the third uppermost fork horizontally moves forward. In other words, the wafers W are taken out from the FOUP 20 by the forks in a sequential order from above, such that when one of the two adjacent forks horizontally moves rearward, the other fork simultaneously, horizontally moves forward. When the number of the forks is four, for example, the four wafers W which are vertically, successively arranged in the FOUP 20 are taken out from the FOUP 20.

Similarly, when the first transfer apparatus 50 including more than two forks carries the wafers W held by the respective forks to the transit unit 30 in a sequential order from above, the wafers W held on the forks are passed onto the projection members 33 of the transit unit 30, such that when one of the two adjacent forks horizontally moves rearward, the other fork simultaneously, horizontally moves forward.

Second Embodiment

A second embodiment of the present invention will be described below with reference to the drawings. FIGS. 13(a) to 13(d) are schematic consecutive views of another series of step performed when the wafer is carried from a wafer transfer apparatus to a transit unit in a substrate process system in this embodiment.

A substrate process system 10 in the second embodiment differs from the substrate process system 10 in the first embodiment only in that the second distance P2 and the third distance P3 are substantially equal to each other. Namely, although the second distance P2 is equal to the sum of the third distance P3 and the loading stroke amount ST2 in the first embodiment, the second distance P2 and the third distance P3 are substantially equal to each other in the second embodiment. Other structure of the substrate process system 10 in the second embodiment is the same as that of the first embodiment.

In this embodiment, the parts having the same structure and function as those of the first embodiment shown in FIGS. 1 to 12 are shown by the same reference numbers, and their description is omitted.

How wafers W held by forks 54a and 54b of a first wafer transfer apparatus 50 are carried to a transit unit 30 is described. At first, the forks 54a and 54b are simultaneously moved to preloading positions which are located above positions on which the wafers W are to be placed. Then, a support base 55 is moved downward by a predetermined loading stroke amount ST2, the forks 54a and 54b are simultaneously moved downward from the pre-loading positions by the loading stroke amount ST2. In the course of the downward movement of the forks 54a and 54b, top portions of projection members 33 of the transit unit 30 come into contact with the bottom surfaces of the wafers W held on the forks 54a and 54b, so that the wafers W are passed to the transit unit 30.

In order to allow such an operation of the first wafer transfer apparatus 50, it is necessary to set the distance P2 between the wafers W in the transit unit 30 to be substantially equal to the third distance P3 between the forks of the first wafer transfer apparatus 50. More specifically, the second distance P2 and the third distance P3 are set about 16.5 mm, respectively.

Next, details of a series of operations for carrying two wafers W held by the first wafer transfer apparatus 50 in this embodiment to the transit unit 30 are described with reference to FIGS. 13(a) to 13(d).

As shown in FIG. 13(a), the first wafer transfer apparatus 50 approaches the transit unit 30, at first. Before this movement, the support base 55 is vertically moved such that height levels of the upper fork 54a and the lower fork 54b are equal to height levels of the corresponding pre-loading positions, respectively. When the height levels of the upper and lower forks 54a and 54b are equal to the height levels of the corresponding pre-loading positions, a distance R2 between the bottom surface of the one wafer W held by the upper fork 54a and the one projection member 33a of the transit unit 30 is smaller than the loading stroke amount ST2. Since the second distance P2 and the third distance P3 are substantially equal to each other, a distance between the bottom surface of the other wafer W held by the fork 54b and the other projection member 33b of the transit unit 30 is substantially equal to the distance R2 (see, FIG. 13(a)).

Then, the upper fork 54a and the lower fork 54b are simultaneously, horizontally moved forward to the corresponding pre-loading positions, as shown in FIG. 13(b).

Then, as shown in FIG. 13(c), the support base 55 is moved downward by the loading stroke amount ST2. Since the upper fork 54a and the lower fork 54b are respectively moved downward by the loading stroke amount ST2, the one wafer W with its rear surface supported by the upper fork 54a is passed to the one projection member 33a of the transit unit 30, and the other wafer W with its rear surface supported by the lower fork 54b is passed to the other projection member 33b of the transit unit 30.

Finally, the upper fork 54a and the lower fork 54b are simultaneously, horizontally moved rearward. Thus, as shown in FIG. 13(d), the upper fork 54a and the lower fork 54b are retracted from the transit unit 30. In this manner, the series of operations for carrying the two wafers W held by the first wafer transfer apparatus 50 to the transit unit 30 is completed.

According to the wafer transfer apparatus 50 in this embodiment, when the wafer W held by the fork 54a (54b) is carried to the transit unit 30, the fork 54a (54b) moves downward by the predetermined loading stroke ST2 from the pre-loading position which is located above a position on which the wafer W is to be placed, so that the wafer W is carried to the transit unit 30. The third distance P3 between the forks 54a and 54b is substantially equal to the second distance P2 between the wafers W in the transit unit 30.

That is to say, when the wafers W held in the wafer transfer apparatus 50 are carried to the transit unit 30, all the forks 54a and 54b holding the wafers W are simultaneously, horizontally moved forward at first to the corresponding pre-loading positions. Then, all the forks 54a and 54b are simultaneously moved downward, so that the wafers W held by the forks 54a and 54b are carried to the transit unit 30. Thereafter, all the forks 54a and 54b are simultaneously, horizontally moved rearward to be retracted form the transit unit 30.

In the step for carrying the wafers W to the transit unit 30, the horizontal forward movement and the horizontal rearward movement of all the forks 54a and 54b are simultaneously carried out. Further, all the wafers W held by the forks 54a and 54b are collectively carried to the transit unit 30 by means of the one downward movement of the forks 54a and 54b. Thus, as compared with the first embodiment in which the horizontal rearward movement of the upper fork 54a and the horizontal forward movement of the lower fork 54b are simultaneously carried out, a time required for carrying the wafers W by the wafer transfer apparatus 50 to the transit unit 30 can be more shortened. Thus, the wafer transfer apparatus 50 can furthermore rapidly transfer the wafers W from a FOUP 20 to the transit unit 30.

The substrate process system 10 is not limited to the above embodiment, and various changes and modifications can be made. For example, the number of forks of the first wafer transfer apparatus 50 is not limited to two. The first wafer transfer apparatus 50 may include more than two forks. In this case, the forks are disposed on a fork support member 53 such that the forks are vertically spaced apart from each other with the predetermined third distance P3 therebetween. When the wafers W held by the forks are carried to the transit unit 30, more than two forks each holding the wafer W are simultaneously, horizontally moved forward, and then all the forks are simultaneously moved downward, so that the respective wafers W are carried from the forks to the transit unit 30. Thereafter, all the forks are simultaneously, horizontally moved rearward. Thus, the wafers W held by the respective forks can be carried to the transit unit 30 for a shorter period of time.

Third Embodiment

A third embodiment of the present invention will be described below. A substrate process system 10 in the third embodiment differs from the substrate process system 10 in the second embodiment shown in FIG. 13 only in that a relationship between the first distance P1 between the wafers W in the FOUP 20, the third distance P3 between the forks of the first wafer transfer apparatus 50, and the unloading stroke amount ST1 are not specifically defined. Other structure of the substrate process system 10 in the third embodiment shown in FIG. 13 is the same as that of the second embodiment.

Figure 13:
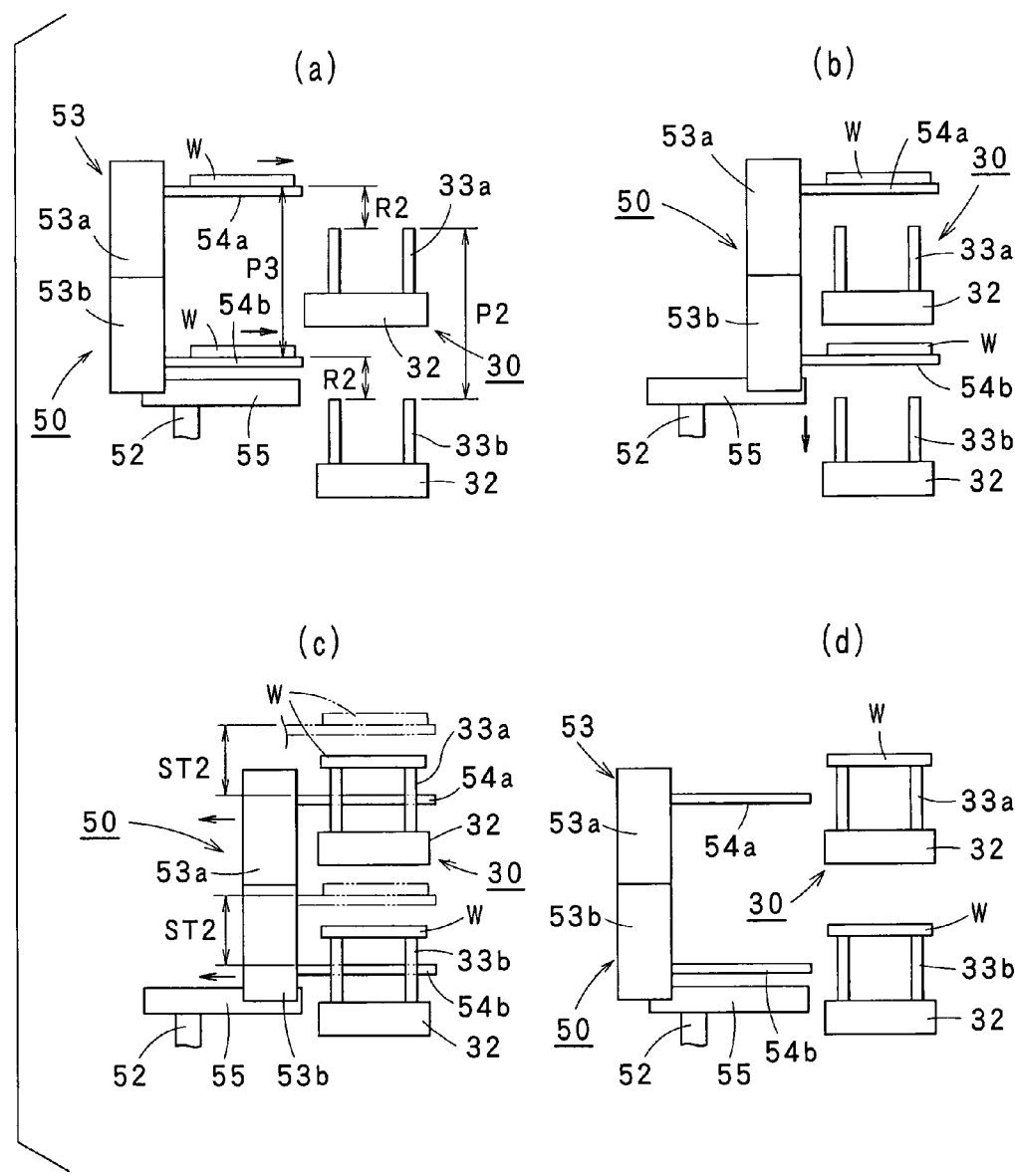
FIGS. 13(a) to 13(d) are schematic consecutive views of another series of operations performed when the wafers are carried from the wafer transfer apparatus to the transit unit.

In this embodiment, the parts having the same structure and function as those of the second embodiment shown in FIG. 13 are shown by the same reference numbers, and their description is omitted.

In a substrate process system 10 in this embodiment, a second distance P2 between wafers W in a transit unit 30 is previously set about 23 mm or more, similar to the first embodiment. As described in the second embodiment, the second distance P2 between the wafers W in the transit unit 30 and a third distance P3 between forks of the first wafer transfer apparatus 50 are set such that the second distance P2 and the third distance P3 are substantially equal to each other. To be specific, the third distance P3 between the forks of the first wafer transfer apparatus 50 is set about 23 mm or more.

A first distance P1 between the wafers W in a FOUP 20 of the substrate process system 10 is previously set about 10 mm. In terms of the number of wafers W contained in the FOUP 20, the distance P1 cannot be enlarged any more. Thus, when the wafers W are taken out from the FOUP 20 by the first wafer transfer apparatus 50, a fork 54a does not cooperate with a fork 54b, but the forks 54a and 54b independently move to take out the wafer W from the FOUP 20.

That is to say, when the wafers W are taken out from the FOUP 20, the upper fork 54a is horizontally moved forward at first, and then moved upward so that the wafer W is lifted by the fork 54a and held thereon. Then, the upper fork 54a is horizontally moved rearward. Thereafter, a support base 55 is moved in a height direction such that a height level of the lower fork 54b is substantially equal to a height level of a pre-unloading position. Then, the lower fork 54b is horizontally moved forward and then moved upward so that the wafer W is lifted by the fork 54b and held thereon. Finally, the lower fork 54b is horizontally moved rearward. According to the substrate process system 10 in this embodiment, a step for taking out the wafers W from the FOUP 20 by the first wafer transfer apparatus 50 takes longer than that of the first embodiment. However, a step for carrying the wafers W held by the first wafer transfer apparatus 50 to the transit unit 30 can be shortened as compared with the step in the first embodiment.

According to the substrate process system 10 and the wafer transfer apparatus 50 in this embodiment, a time required for the wafer transfer apparatus 50 to carry the wafers W to the transit unit 30 can be shortened, as compared with a case in which a single fork transfers the wafers W. Therefore, the wafer transfer apparatus 50 can more rapidly transfer the wafers W from the FOUP 20 to the transit unit 30.

What is claimed is:

1. A substrate transfer apparatus for transferring a substrate from a first substrate containing part for containing a plurality of substrates that are vertically spaced apart from each other by a first distance, P1, therebetween to a second substrate containing part for containing a plurality of substrates, the substrate transfer apparatus comprising:
   a plurality of forks for holding substrates, wherein when the plurality of forks respectively transfer the substrates from the first substrate containing part to the second substrate containing part, the plurality of forks respectively hold the substrates;
   a fork support part disposing the forks with a vertical spacing, P3, therebetween to be equal to a sum of the first distance, P1, and a predetermined unloading stroke amount, ST1, from a pre-unloading position located below the substrate to be taken out;
   a horizontal moving mechanism for independently, horizontally moving the forks with respect to each other;
   a vertical moving mechanism for simultaneously, vertically moving at least two forks disposed on the fork support part relative to the first substrate containing part and the second substrate containing part; and
   a control device for controlling the horizontal moving mechanism to take out substrates from the first substrate containing part by causing the horizontal moving mechanism to move an upper fork of two adjacent forks horizontally forward to the pre-unloading position below a substrate to be taken out, thereafter controlling the vertical mechanism to cause the upper fork and the adjacent fork therebelow simultaneously to move upward so that the substrate is lifted by the upper fork and supported thereon, thereafter controlling the horizontal moving mechanism to cause the upper fork holding the substrate to retract from the first substrate containing part and to cause the adjacent lower fork to move to the pre-unloading position located below another substrate to be taken out, and thereafter controlling the vertical moving mechanism to cause the upper fork and the lower fork simultaneously to further move upward so that the another substrate is lifted by the lower fork and supported thereon.

2. The substrate transfer apparatus according to claim 1, wherein:
   the second substrate containing part is configured to contain the plurality of substrates that are vertically spaced apart from each other with a second distance, P2, therebetween, wherein the second distance P2 is different than the first distance P1;
   when the forks carry the substrates held by the forks to the second substrate containing part, each of the forks moves downward by a predetermined loading stroke amount, ST2, from a pre-loading position located above a position on which the substrate is to be placed so as to pass the substrate to the second substrate containing part, wherein both the upper and lower fork move from the pre-loading position simultaneously; and
   the third distance, P3, between the forks is a value obtained by subtracting the loading stroke amount, ST2, from the second distance, P2, between the substrates in the second substrate containing part.

3. The substrate transfer apparatus according to claim 1, wherein:
   the second substrate containing part is configured to contain the plurality of substrates that are vertically spaced apart from each other with a second distance, P2, therebetween, wherein the second distance P2 is different than the first distance P1;
   when the forks carry the substrates held by the forks to the second substrate containing part, each of the forks moves downward from a pre-loading position located above a position on which the substrate to be placed so as to pass the substrate to the substrate containing part and the substrates held by the plurality of forks are placed in the second substrate containing part simultaneously; and
   a value of the third distance, P3, between the forks is substantially equal to a value of the distance, P2, between the substrates in the second substrate containing part.

4. A substrate transfer apparatus for transferring a substrate from a first substrate containing part for containing a plurality of substrates that are vertically spaced apart from each other by a first distance, P1, therebetween to a second substrate containing part for containing a plurality of substrates that are vertically spaced apart from each other with a second distance, P2, therebetween, the second distance, P2, being larger than the first distance, P1, the substrate transfer apparatus comprising:
   a plurality of forks for holding substrates, wherein when the plurality of forks respectively transfer the substrates from the first substrate containing part to the second substrate containing part, the plurality of forks respectively hold the substrates;
   a fork support part disposing the forks with a vertical spacing, P3, therebetween to be equal to a sum of the first distance, P1, and a predetermined unloading stroke amount, ST1, that is a pre-unloading position located below the substrate to be taken out, and P1 also is substantially equal to the second distance, P2;
   a horizontal moving mechanism for independently, horizontally moving the forks with respect to each other,
   a vertical moving mechanism for simultaneously, vertically moving at least two forks disposed on the fork support part relative to the first substrate containing part and the second substrate containing part; and
   a control device for controlling the horizontal moving mechanism to take out substrates from the first substrate containing part by causing the horizontal moving mechanism to move an upper fork of two adjacent forks horizontally forward to the pre-unloading position below a substrate to be taken out, thereafter controlling the vertical mechanism to cause the upper fork and the substrate is lifted by the upper fork and supported thereon, thereafter controlling the horizontal moving mechanism to cause the upper fork holding the substrate to retract from the first substrate containing part and to cause the adjacent lower fork to move to the pre-unloading position located below another substrate to be taken out, and thereafter controlling the vertical moving mechanism to cause the upper fork and the lower fork simultaneously to further move upward so that the another substrate is lifted by the lower fork and supported thereon.

5. A substrate process system comprising:
   a stage on which a first substrate containing part is placed, that first substrate containing part containing a plurality of substrates that are vertically spaced apart from each other;

a second substrate containing part for containing a plurality of substrates;

a substrate transfer apparatus for transferring a first substrate containing part to a second substrate containing part, including: a plurality of forks for holding substrates, wherein when the plurality of forks respectively transfer the substrates from the first substrate containing part to the second substrate containing part, the plurality of forks respectively hold the substrates; a fork support part disposing the forks with a vertical spacing, P3, therebetween to be equal to a sum of the first distance, P1, and a predetermined unloading stroke amount, ST1, that is a pre-unloading position located below the substrate to be taken out; a horizontal moving mechanism for independently, horizontally moving the forks with respect to each other; and a vertical moving mechanism for simultaneously, vertically moving at least two forks disposed on the fork support part relative to the first substrate containing part and the second substrate containing part; and a control device for controlling the forks of the substrate transfer apparatus in such a manner that, when the substrates are taken out from the first substrate containing part, the one upper fork of the two adjacent forks of the plurality of forks is horizontally moved forward to the pre-unloading position located below the substrate to be taken out by the one fork, then the one fork and the other fork therebelow are simultaneously moved upward so that the substrate is lifted by the one fork and supported thereon, then the one fork is horizontally moved rearward and simultaneously therewith the other fork is horizontally moved forward so that the one fork holding the substrate is retracted from the first substrate containing part and the other fork is moved to the pre-unloading position located below the substrate to be taken out by the other fork, and then the one fork and the other fork are simultaneously further moved upward so that the substrate is lifted by the other fork and supported thereon.

6. The substrate process system according to claim 5, wherein the second substrate containing part is configured to contain the plurality of substrates that are vertically spaced apart from each other, and the control device controls the forks of the substrate transfer apparatus in such a manner that, when the substrates held by the forks are passed to the second substrate containing part, the one upper fork of the two adjacent forks of the plurality of forks is horizontally moved forward to a pre-loading position located above a position on which the substrate is to be placed, then the one fork and the other fork are simultaneously moved downward so that the substrate held by the one fork is passed to the second substrate containing part, then the one fork is horizontally moved rearward and simultaneously therewith the other fork is horizontally moved forward so that the one fork is retracted from the second substrate containing part and the other fork holding the substrate is moved to the pre-loading position located above a position on which the substrate is to be placed, and then the one fork and the other fork are simultaneously further moved downward so that the substrate held by the other fork is passed to the second substrate containing part.

7. The substrate process system according to claim 5, wherein the second substrate containing part is configured to contain the plurality of substrates that are vertically spaced apart from each other, and the control device controls the forks of the substrate transfer apparatus in such a manner that, when the substrates held by the forks are passed to the second substrate containing part, all the forks holding the substrates are simultaneously, horizontally moved forward to corresponding pre-loading positions located above positions on which the substrates are to be placed, then all the forks simultaneously moved downward to pass the substrates held by the forks to the second substrate containing part, and then all the forks are simultaneously, horizontally moved rearward so that the forks are respectively retracted from the second substrate containing part.

* * * * *